US011636855B2

(12) United States Patent
Taylor et al.

(10) Patent No.: US 11,636,855 B2
(45) Date of Patent: Apr. 25, 2023

(54) MEDIA CONTENT BASED ON OPERATIONAL DATA

(71) Applicant: Sonos, Inc., Santa Barbara, CA (US)

(72) Inventors: Ryan Taylor, Santa Barbara, CA (US); Dmitri Siegel, Ojai, CA (US); Helen McDermott, Los Angeles, CA (US)

(*) Notice: Subject to any disclaimer, the term of this patent is extended or adjusted under 35 U.S.C. 154(b) by 318 days.

(21) Appl. No.: 16/680,232

(22) Filed: Nov. 11, 2019

(65) Prior Publication Data

US 2021/0142799 A1 May 13, 2021

(51) Int. Cl.
| | |
|---|---|
| H04N 21/458 | (2011.01) |
| G10L 15/22 | (2006.01) |
| G10L 25/84 | (2013.01) |
| H03G 3/20 | (2006.01) |
| H03G 1/02 | (2006.01) |
| H03G 3/02 | (2006.01) |

(52) U.S. Cl.
CPC .............. *G10L 15/22* (2013.01); *G10L 25/84* (2013.01); *H03G 1/02* (2013.01); *H03G 3/02* (2013.01); *H03G 3/20* (2013.01); *G10L 2015/223* (2013.01)

(58) Field of Classification Search
CPC .............................. G10L 15/22; H04N 21/458
See application file for complete search history.

(56) References Cited

U.S. PATENT DOCUMENTS

| | | | |
|---|---|---|---|
| 5,406,634 A | 4/1995 | Anderson et al. | |
| 5,440,644 A | 8/1995 | Farinelli et al. | |
| 5,761,320 A | 6/1998 | Farinelli et al. | |
| 5,856,827 A | 1/1999 | Sudo | |
| 5,923,902 A | 7/1999 | Inagaki | |
| 6,002,862 A | 12/1999 | Takaike | |

(Continued)

FOREIGN PATENT DOCUMENTS

| | | |
|---|---|---|
| EP | 1389853 A1 | 2/2004 |
| KR | 100890993 | 3/2009 |

(Continued)

OTHER PUBLICATIONS

AudioTron Quick Start Guide, Version 1.0, Mar. 2001, 24 pages.

(Continued)

*Primary Examiner* — Seong-Ah A Shin

(57) ABSTRACT

An example computing system that maintains a playlist of media items for playback by one or more playback devices receives, from a first playback device, a request to play back the playlist and first operational data and also receives, from a second playback device, a request to play back the playlist and second operational data. The computing system provides the media items in the playlist to the first and second playback devices for substantially synchronous playback and, based on the first and second operational data, determines respective first and second advertisements. The computing system provides the first advertisement to the first playback device for playback during a given time slot designated for advertisements, and also provides the second advertisement to the second playback device for playback during the given time slot, such that the second playback device plays the second advertisement while the first playback device plays the first advertisement.

20 Claims, 17 Drawing Sheets

(56) References Cited

U.S. PATENT DOCUMENTS

| | | |
|---|---|---|
| 6,029,195 A | 2/2000 | Herz |
| 6,032,202 A | 2/2000 | Lea et al. |
| 6,108,686 A | 8/2000 | Williams, Jr. |
| 6,181,316 B1 | 1/2001 | Little et al. |
| 6,255,961 B1 | 7/2001 | Van et al. |
| 6,256,554 B1 | 7/2001 | DiLorenzo |
| 6,349,339 B1 | 2/2002 | Williams |
| 6,404,811 B1 | 6/2002 | Cvetko et al. |
| 6,469,633 B1 | 10/2002 | Wachter et al. |
| 6,522,886 B1 | 2/2003 | Youngs et al. |
| 6,587,127 B1 | 7/2003 | Leeke et al. |
| 6,611,537 B1 | 8/2003 | Edens et al. |
| 6,631,410 B1 | 10/2003 | Kowalski et al. |
| 6,728,531 B1 | 4/2004 | Lee et al. |
| 6,732,155 B2 | 5/2004 | Meek |
| 6,757,517 B2 | 6/2004 | Chang et al. |
| 6,778,869 B2 | 8/2004 | Champion |
| 6,826,283 B1 | 11/2004 | Wheeler et al. |
| 6,985,694 B1 | 1/2006 | De Bonet et al. |
| 7,017,118 B1 | 3/2006 | Carroll |
| 7,020,048 B2 | 3/2006 | McComas |
| 7,113,833 B1 | 9/2006 | Brown et al. |
| 7,117,451 B2 | 10/2006 | Sielken |
| 7,124,125 B2 | 10/2006 | Cook et al. |
| 7,130,608 B2 | 10/2006 | Hollstrom et al. |
| 7,130,616 B2 | 10/2006 | Janik |
| 7,143,939 B2 | 12/2006 | Henzerling |
| 7,187,947 B1 | 3/2007 | White et al. |
| 7,236,739 B2 | 6/2007 | Chang |
| 7,236,773 B2 | 6/2007 | Thomas |
| 7,295,548 B2 | 11/2007 | Blank et al. |
| 7,312,785 B2 | 12/2007 | Tsuk et al. |
| 7,358,960 B2 | 4/2008 | Mak |
| 7,391,791 B2 | 6/2008 | Balassanian et al. |
| 7,483,538 B2 | 1/2009 | McCarty et al. |
| 7,496,623 B2 | 2/2009 | Szeto et al. |
| 7,496,633 B2 | 2/2009 | Szeto et al. |
| 7,571,014 B1 | 8/2009 | Lambourne et al. |
| 7,580,325 B2 | 8/2009 | Welk et al. |
| 7,599,685 B2 | 10/2009 | Goldberg et al. |
| 7,630,501 B2 | 12/2009 | Blank et al. |
| 7,643,894 B2 | 1/2010 | Braithwaite et al. |
| 7,657,224 B2 | 2/2010 | Goldberg et al. |
| 7,657,910 B1 | 2/2010 | McAulay et al. |
| 7,725,533 B2 | 5/2010 | Szeto et al. |
| 7,725,551 B2 | 5/2010 | Szeto et al. |
| 7,739,271 B2 | 6/2010 | Cook et al. |
| 7,739,596 B2 | 6/2010 | Clarke-Martin et al. |
| 7,742,740 B2 | 6/2010 | Goldberg et al. |
| 7,774,078 B2 | 8/2010 | Booth et al. |
| 7,805,682 B1 | 9/2010 | Lambourne |
| 7,835,689 B2 | 11/2010 | Goldberg et al. |
| 7,853,341 B2 | 12/2010 | McCarty et al. |
| 7,865,137 B2 | 1/2011 | Goldberg et al. |
| 7,912,565 B2 | 3/2011 | Tazime et al. |
| 7,916,877 B2 | 3/2011 | Goldberg et al. |
| 7,917,082 B2 | 3/2011 | Goldberg et al. |
| 7,962,482 B2 | 6/2011 | Handman et al. |
| 7,987,294 B2 | 7/2011 | Bryce et al. |
| 7,987,426 B2 | 7/2011 | Cotter et al. |
| 3,014,423 A1 | 9/2011 | Thaler et al. |
| 8,023,663 B2 | 9/2011 | Goldberg |
| 8,028,038 B2 | 9/2011 | Weel |
| 8,028,323 B2 | 9/2011 | Weel |
| 8,045,952 B2 | 10/2011 | Qureshey et al. |
| 8,050,652 B2 | 11/2011 | Qureshey et al. |
| 8,074,253 B1 | 12/2011 | Nathan |
| 8,103,009 B2 | 1/2012 | McCarty et al. |
| 8,131,390 B2 | 3/2012 | Braithwaite et al. |
| 8,135,669 B2 | 3/2012 | Olstad et al. |
| 8,214,873 B2 | 7/2012 | Weel |
| 8,230,099 B2 | 7/2012 | Weel |
| 8,234,395 B2 | 7/2012 | Millington |
| 8,392,468 B2 | 3/2013 | Sato |
| 8,392,583 B2 | 3/2013 | Bijwaard et al. |
| 8,483,853 B1 | 7/2013 | Lambourne |
| 8,701,204 B2 | 4/2014 | Carr et al. |
| 8,762,843 B2 | 6/2014 | Morse et al. |
| 8,910,265 B2 | 12/2014 | Lang et al. |
| 8,942,252 B2 | 1/2015 | Balassanian et al. |
| 8,959,085 B2 | 2/2015 | Fisher et al. |
| 9,137,564 B2 | 9/2015 | Reimann |
| 9,232,277 B2 | 1/2016 | Vega-Zayas et al. |
| 9,245,020 B2 | 1/2016 | Joffray et al. |
| 9,247,363 B2 | 1/2016 | Triplett et al. |
| 9,286,384 B2 | 3/2016 | Kuper et al. |
| 9,318,152 B2 | 4/2016 | Kretz et al. |
| 9,326,070 B2 | 4/2016 | Bender et al. |
| 9,338,514 B2 | 5/2016 | Kumar et al. |
| 9,374,607 B2 | 6/2016 | Bates et al. |
| 9,374,682 B2 | 6/2016 | Weng et al. |
| 9,442,626 B2 | 9/2016 | Schupak et al. |
| 9,467,322 B2 | 10/2016 | Dietrich et al. |
| 9,478,247 B2 | 10/2016 | Chen et al. |
| 9,491,499 B2 * | 11/2016 | Wagenaar ............ H04L 65/765 |
| 9,501,533 B2 | 11/2016 | Coburn, IV et al. |
| 9,524,338 B2 | 12/2016 | Van Der Heide et al. |
| 9,547,641 B2 | 1/2017 | Badaskar et al. |
| 9,549,010 B2 | 1/2017 | Samuell et al. |
| 9,665,339 B2 | 5/2017 | Reimann et al. |
| 9,674,587 B2 | 6/2017 | Triplett et al. |
| 9,680,960 B2 | 6/2017 | Chen et al. |
| 9,690,466 B2 | 6/2017 | Coburn et al. |
| 9,703,521 B2 | 7/2017 | Kumar et al. |
| 9,705,950 B2 | 7/2017 | Trammell et al. |
| 9,729,599 B2 | 8/2017 | Beckhardt et al. |
| 9,735,978 B2 | 8/2017 | Kumar et al. |
| 9,882,945 B2 | 1/2018 | Frankel et al. |
| 9,930,470 B2 | 3/2018 | Reilly et al. |
| 9,947,316 B2 | 4/2018 | Millington et al. |
| 10,028,028 B2 | 7/2018 | Kumar |
| 10,057,662 B2 | 8/2018 | Talukder |
| 10,063,600 B1 | 8/2018 | Marsh et al. |
| 10,095,469 B2 | 10/2018 | Reimann et al. |
| 10,102,855 B1 * | 10/2018 | Sindhwani ............ G06F 40/134 |
| 10,129,599 B2 | 11/2018 | Van Der Heide |
| 10,134,059 B2 | 11/2018 | Mishra et al. |
| 10,154,122 B1 | 12/2018 | Coburn, IV et al. |
| 10,268,352 B2 | 4/2019 | Coburn, IV et al. |
| 10,268,357 B2 | 4/2019 | Vega et al. |
| 10,296,884 B2 | 5/2019 | Lang et al. |
| 10,359,990 B2 | 7/2019 | Reimann et al. |
| 10,389,782 B2 | 8/2019 | Alsina et al. |
| 10,409,546 B2 | 9/2019 | Zalon et al. |
| 10,423,382 B2 | 9/2019 | De Angelis et al. |
| 10,433,057 B2 | 10/2019 | Banerjee et al. |
| 10,447,803 B2 | 10/2019 | Wilde |
| 10,509,558 B2 | 12/2019 | Chen et al. |
| 10,678,500 B2 | 6/2020 | Reimann et al. |
| 10,715,973 B2 | 7/2020 | Kumar et al. |
| 10,877,637 B1 * | 12/2020 | Antos ...................... G06F 21/32 |
| 11,016,727 B2 | 5/2021 | Reimann et al. |
| 11,036,467 B2 | 6/2021 | Reimann et al. |
| 11,100,922 B1 * | 8/2021 | Mutagi ...................... G06F 3/167 |
| 11,178,716 B2 * | 11/2021 | Baik ..................... H04W 76/19 |
| 2001/0042107 A1 | 11/2001 | Palm |
| 2002/0002039 A1 | 1/2002 | Qureshey et al. |
| 2002/0022453 A1 | 2/2002 | Balog et al. |
| 2002/0026442 A1 | 2/2002 | Lipscomb et al. |
| 2002/0040352 A1 | 4/2002 | McCormick |
| 2002/0056117 A1 | 5/2002 | Hasegawa et al. |
| 2002/0124097 A1 | 9/2002 | Isely et al. |
| 2002/0163361 A1 | 11/2002 | Parkin |
| 2002/0165921 A1 | 11/2002 | Sapieyevski |
| 2002/0178191 A1 | 11/2002 | Sielken |
| 2003/0023741 A1 | 1/2003 | Tomassetti et al. |
| 2003/0073432 A1 | 4/2003 | Meade |
| 2003/0152226 A1 | 8/2003 | Candelore et al. |
| 2003/0157951 A1 | 8/2003 | Hasty |
| 2003/0210796 A1 | 11/2003 | McCarty et al. |
| 2003/0221541 A1 | 12/2003 | Platt |
| 2004/0024478 A1 | 2/2004 | Hans et al. |
| 2004/0025185 A1 | 2/2004 | Goci et al. |
| 2004/0078383 A1 | 4/2004 | Mercer et al. |

(56) References Cited

U.S. PATENT DOCUMENTS

| | | |
|---|---|---|
| 2004/0078812 A1 | 4/2004 | Calvert |
| 2004/0088328 A1 | 5/2004 | Cook et al. |
| 2004/0215611 A1 | 10/2004 | Jawa et al. |
| 2004/0261040 A1 | 12/2004 | Radcliffe et al. |
| 2005/0108320 A1 | 5/2005 | Lord et al. |
| 2005/0166157 A1 | 7/2005 | Ollis et al. |
| 2006/0107237 A1 | 5/2006 | Kim |
| 2006/0168340 A1 | 7/2006 | Heller et al. |
| 2006/0253436 A1 | 11/2006 | Cook et al. |
| 2006/0253782 A1 | 11/2006 | Stark et al. |
| 2007/0025194 A1 | 2/2007 | Morse et al. |
| 2007/0038999 A1 | 2/2007 | Millington |
| 2007/0088747 A1 | 4/2007 | Cheng et al. |
| 2007/0142944 A1 | 6/2007 | Goldberg et al. |
| 2007/0214106 A1 | 9/2007 | Johnston et al. |
| 2007/0239562 A1 | 10/2007 | Lawson |
| 2007/0266843 A1 | 11/2007 | Schneider |
| 2007/0288470 A1 | 12/2007 | Kauniskangas et al. |
| 2007/0294131 A1 | 12/2007 | Roman et al. |
| 2008/0005690 A1 | 1/2008 | Van Vugt |
| 2008/0016465 A1 | 1/2008 | Foxenland |
| 2008/0040283 A1 | 2/2008 | Morris |
| 2008/0052371 A1 | 2/2008 | Partovi et al. |
| 2008/0066102 A1 | 3/2008 | Abraham et al. |
| 2008/0086750 A1 | 4/2008 | Yasrebi et al. |
| 2008/0131085 A1 | 6/2008 | Ikeda et al. |
| 2008/0155588 A1 | 6/2008 | Roberts et al. |
| 2008/0211661 A1 | 9/2008 | Gifford et al. |
| 2008/0250328 A1 | 10/2008 | Konttinen |
| 2009/0031254 A1 | 1/2009 | Herpel et al. |
| 2009/0063975 A1 | 3/2009 | Bull et al. |
| 2009/0106297 A1 | 4/2009 | Wright et al. |
| 2009/0157680 A1 | 6/2009 | Crossley et al. |
| 2009/0164902 A1 | 6/2009 | Cohen et al. |
| 2009/0171715 A1 | 7/2009 | Conley et al. |
| 2009/0228919 A1 | 9/2009 | Zott et al. |
| 2009/0234878 A1 | 9/2009 | Herz et al. |
| 2009/0249222 A1 | 10/2009 | Schmidt et al. |
| 2009/0292819 A1 | 11/2009 | Kandekar et al. |
| 2009/0307062 A1 | 12/2009 | Lutnick et al. |
| 2010/0017366 A1 | 1/2010 | Robertson et al. |
| 2010/0082641 A1 | 4/2010 | Rinckes et al. |
| 2010/0205222 A1 | 8/2010 | Gajdos et al. |
| 2010/0235741 A1 | 9/2010 | Newman et al. |
| 2010/0262909 A1 | 10/2010 | Hsieh |
| 2010/0268360 A1 | 10/2010 | Ingrassia et al. |
| 2010/0281369 A1 | 11/2010 | Bell et al. |
| 2010/0293187 A1 | 11/2010 | Biehn et al. |
| 2011/0004330 A1 | 1/2011 | Rothkopf et al. |
| 2011/0106954 A1 | 5/2011 | Chatterjee et al. |
| 2011/0131272 A1 | 6/2011 | Littlejohn et al. |
| 2011/0154198 A1 | 6/2011 | Bachman et al. |
| 2011/0161348 A1 | 6/2011 | Oron |
| 2012/0023099 A1 | 1/2012 | Crossley et al. |
| 2012/0054233 A1 | 3/2012 | Svendsen et al. |
| 2012/0059914 A1 | 3/2012 | Banger et al. |
| 2012/0071996 A1 | 3/2012 | Svendsen |
| 2012/0089910 A1 | 4/2012 | Cassidy |
| 2012/0117017 A1 | 5/2012 | Phillips et al. |
| 2012/0117586 A1 | 5/2012 | McCoy et al. |
| 2012/0150614 A1 | 6/2012 | Dion et al. |
| 2012/0254256 A1 | 10/2012 | Martin |
| 2012/0254363 A1 | 10/2012 | Martin et al. |
| 2012/0272266 A1* | 10/2012 | Ou .................. H04L 67/306 725/34 |
| 2013/0148720 A1 | 6/2013 | Rabii |
| 2013/0218942 A1 | 8/2013 | Willis et al. |
| 2013/0347018 A1 | 12/2013 | Limp et al. |
| 2014/0005813 A1 | 1/2014 | Reimann |
| 2014/0093114 A1 | 4/2014 | Nguyen et al. |
| 2014/0129015 A1 | 5/2014 | Lindahl et al. |
| 2014/0149553 A1 | 5/2014 | Bank et al. |
| 2014/0245346 A1 | 8/2014 | Cheng et al. |
| 2014/0277639 A1 | 9/2014 | Gomes-Casseres et al. |
| 2014/0368737 A1 | 12/2014 | Hoffert et al. |
| 2015/0095323 A1 | 4/2015 | Bates |
| 2015/0253960 A1 | 9/2015 | Lin et al. |
| 2015/0277851 A1 | 10/2015 | Kumar et al. |
| 2015/0278322 A1 | 10/2015 | Beckhardt |
| 2015/0324552 A1 | 11/2015 | Beckhardt |
| 2015/0355879 A1* | 12/2015 | Beckhardt .............. H04L 41/22 700/94 |
| 2016/0261904 A1 | 9/2016 | Qian et al. |
| 2016/0352797 A1 | 12/2016 | Marusich et al. |
| 2017/0242653 A1 | 8/2017 | Lang et al. |
| 2017/0289202 A1 | 10/2017 | Krasadakis |
| 2017/0330429 A1* | 11/2017 | Tak .................. H04N 21/4112 |
| 2018/0316958 A1* | 11/2018 | Anschutz ........... H04N 21/6405 |
| 2018/0352017 A1 | 12/2018 | Schneider et al. |
| 2019/0138573 A1 | 5/2019 | Land et al. |
| 2019/0155840 A1 | 5/2019 | O'Konski et al. |
| 2019/0279260 A1 | 9/2019 | Carpita et al. |
| 2020/0007926 A1 | 1/2020 | Tang et al. |
| 2020/0275250 A1* | 8/2020 | Choi ................. H04W 12/0431 |
| 2020/0412822 A1* | 12/2020 | Allen .................... H04L 69/329 |
| 2020/0413117 A1 | 12/2020 | Loheide et al. |

FOREIGN PATENT DOCUMENTS

| | | |
|---|---|---|
| WO | 200153994 | 7/2001 |
| WO | 2003093950 A2 | 11/2003 |
| WO | 2012030006 A1 | 3/2012 |
| WO | 2019137897 A1 | 7/2019 |

OTHER PUBLICATIONS

AudioTron Reference Manual, Version 3.0, May 2002, 70 pages.
AudioTron Setup Guide, Version 3.0, May 2002, 38 pages.
Bluetooth "Specification of the Bluetooth System: The ad hoc SCATTERNET for affordable and highly functional wireless connectivity," Core, Version 1.0 A, Jul. 26, 1999, 1068 pages.
Bluetooth "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Palm, Inc., "Handbook for the Palm VII Handheld," May 2000, 311 pages.
Presentations at WinHEC 2000, May 2000, 138 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
International Bureau, International Search Report and Written Opinion dated Jul. 14, 2021, issued in connection with International Application No. PCT/US2021/028205, filed on Apr. 20, 2021, 10 pages.
International Bureau, International Search Report and Written Opinion dated Feb. 5, 2021, issued in connection with International Application No. PCT/US2020/059994, filed on Nov. 11, 2020, 20 pages.

(56) References Cited

OTHER PUBLICATIONS

Non-Final Office Action dated May 12, 2021, issued in connection with U.S. Appl. No. 16/680,234, filed Nov. 11, 2019, 15 pages.
Non-Final Office Action dated Sep. 21, 2020, issued in connection with U.S. Appl. No. 16/680,234, filed Nov. 11, 2019, 13 pages.
Notice of Allowance dated Sep. 7, 2021, issued in connection with U.S. Appl. No. 17/235,704, filed Apr. 20, 2021, 13 pages.
Notice of Allowance dated Feb. 23, 2021, issued in connection with U.S. Appl. No. 16/680,234, filed Nov. 11, 2019, 11 pages.
Non-Final Office Action dated Jan. 19, 2022, issued in connection with U.S. Appl. No. 17/235,691, filed Apr. 20, 2021, 14 pages.
Notice of Allowance dated Nov. 2, 2021, issued in connection with U.S. Appl. No. 17/235,704, filed Apr. 20, 2021, 13 pages.
Notice of Allowance dated Oct. 22, 2021, issued in connection with U.S. Appl. No. 16/680,234, filed Nov. 11, 2019, 11 pages.
Advisory Action dated Sep. 16, 2015, issued in connection with U.S. Appl. No. 13/338,724, filed Dec. 28, 2011, 3 pages.
Advisory Action dated Aug. 8, 2018, issued in connection with U.S. Appl. No. 15/205,479, filed Jul. 8, 2016, 2 pages.
European Patent Office, European Office Action dated Aug. 5, 2019, issued in connection with European Application No. 15806449.3, 6 pages.
European Patent Office, European Search Report dated Oct. 6, 2021, issued in connection with European Application No. 21187081.1, 5 pages.
European Patent Office, European Search Report dated Oct. 5, 2017, issued in connection with EP Application No. 15806449.3, 10 pages.
Final Office Action dated Jul. 8, 2015, issued in connection with U.S. Appl. No. 13/338,724, filed Dec. 28, 2011, 15 pages.
Final Office Action dated May 31, 2018, issued in connection with U.S. Appl. No. 15/205,479, filed Jul. 8, 2016, 10 pages.
First Action Interview Office Action dated Nov. 17, 2016, issued in connection with U.S. Appl. No. 14/300,564, filed Jun. 10, 2014, 3 pages.
International Bureau, International Preliminary Report on Patentability dated Apr. 3, 2014, issued in connection with International Application No. PCT/US2012/056467, filed Sep. 21, 2011, 11 pages.
International Bureau, International Preliminary Report on Patentability dated Dec. 22, 2016, issued in connection with International Application No. PCT/US2015/032169, filed May 22, 2015, 7 pages.
International Searching Authority, International Search Report and Written Opinion dated Oct. 8, 2015, issued in connection with International Application No. PCT/US2015/032169, filed May 22, 2015, 10 pages.
International Searching Authority, International Search Report and Written Opinion dated Feb. 28, 2013, issued in connection with International Application No. PCT/US2012/056467, filed on Sep. 21, 2012, 12 pages.
Non-Final Office Action dated Nov. 1, 2017, issued in connection with U.S. Appl. No. 15/205,479, filed Jul. 8, 2016, 7 pages.
Non-Final Office Action dated Oct. 6, 2016, issued in connection with U.S. Appl. No. 13/338,724, filed Dec. 28, 2011, 15 pages.
Non-Final Office Action dated Nov. 16, 2018, issued in connection with U.S. Appl. No. 15/205,479, filed Jul. 8, 2016, 8 pages.
Non-Final Office Action dated Oct. 17, 2017, issued in connection with U.S. Appl. No. 15/613,762, filed Jun. 5, 2017, 13 pages.
Non-Final Office Action dated Oct. 17, 2019, issued in connection with U.S. Appl. No. 16/447,644, filed Jun. 20, 2019, 8 pages.
Non-Final Office Action dated Nov. 21, 2014, issued in connection with U.S. Appl. No. 13/338,724, filed Dec. 28, 2011, 18 pages.
Non-Final Office Action dated Dec. 28, 2017, issued in connection with U.S. Appl. No. 15/205,753, filed Jul. 8, 2016, 7 pages.
Non-Final Office Action dated Mar. 30, 2022, issued in connection with U.S. Appl. No. 17/347,031, filed Jun. 14, 2021, 10 pages.
Non-Final Office Action dated Mar. 31, 2022, issued in connection with U.S. Appl. No. 17/570,858, filed Jan. 7, 2022, 11 pages.
Non-Final Office Action dated Mar. 4, 2021, issued in connection with U.S. Appl. No. 17/132,661, filed Dec. 23, 2020, 11 pages.
Non-Final Office Action dated Aug. 5, 2020, issued in connection with U.S. Appl. No. 15/999,400, filed Aug. 20, 2018, 12 pages.
Non-Final Office Action dated Jul. 9, 2020, issued in connection with U.S. Appl. No. 16/895,747, filed Jun. 8, 2020, 9 pages.
Notice of Allowance dated Jun. 8, 2022, issued in connection with U.S. Appl. No. 17/235,691, filed Apr. 20, 2021, 6 pages.
Notice of Allowance dated Apr. 11, 2017, issued in connection with U.S. Appl. No. 13/338,724, filed Dec. 28, 2011, 8 pages.
Notice of Allowance dated Mar. 11, 2021, issued in connection with U.S. Appl. No. 15/999,400, filed Aug. 20, 2018, 9 pages.
Notice of Allowance dated Jul. 13, 2018, issued in connection with U.S. Appl. No. 15/205,753, filed Jul. 8, 2016, 5 pages.
Notice of Allowance dated Mar. 13, 2019, issued in connection with U.S. Appl. No. 15/205,479, filed Jul. 8, 2016, 8 pages.
Notice of Allowance dated Apr. 16, 2021, issued in connection with U.S. Appl. No. 17/132,661, filed Dec. 23, 2020, 9 pages.
Notice of Allowance dated Jun. 17, 2022, issued in connection with U.S. Appl. No. 17/347,031, filed Jun. 14, 2021, 7 pages.
Notice of Allowance dated Jun. 23, 2022, issued in connection wtih U.S. Appl. No. 17/570,858, filed Jan. 7, 2022, 7 pages.
Notice of Allowance dated Mar. 23, 2017, issued in connection with U.S. Appl. No. 14/300,564, filed Jun. 10, 2014, 14 pages.
Notice of Allowance dated Apr. 27, 2018, issued in connection with U.S. Appl. No. 15/613,762, filed Jun. 5, 2017, 11 pages.
Notice of Allowance dated Jan. 30, 2020, issued in connection with U.S. Appl. No. 16/447,644, filed Jun. 20, 2019, 7 pages.
Notice of Allowance dated Feb. 9, 2021, issued in connection with U.S. Appl. No. 16/895,747, filed Jun. 8, 2020, 7 pages.
Office Communicaiton dated Nov. 8, 2016, issued in connection with U.S. Appl. No. 14/300,564, filed Jun. 10, 2014, 3 pages.
Preinterview First Office Action dated Nov. 1, 2016, issued in connection with U.S. Appl. No. 14/300,564, filed Jun. 10, 2014, 5 pages.
PRISMIQ, Inc., "PRISMIQ Media Player User Guide," 2003, 44 pages.
Van Buskirk, Eliot, "Music Needs 'Connective Tissue' and Facebook Wants to Build It," E http://evolver.fm/2011/09/01/music-need-connective-tissue-and-facebood-wants-to-build-it, 2011, 6 pages.
Yamaha DME Designer 3.0 Owner's Manual; Copyright 2008, 501 pages.

\* cited by examiner

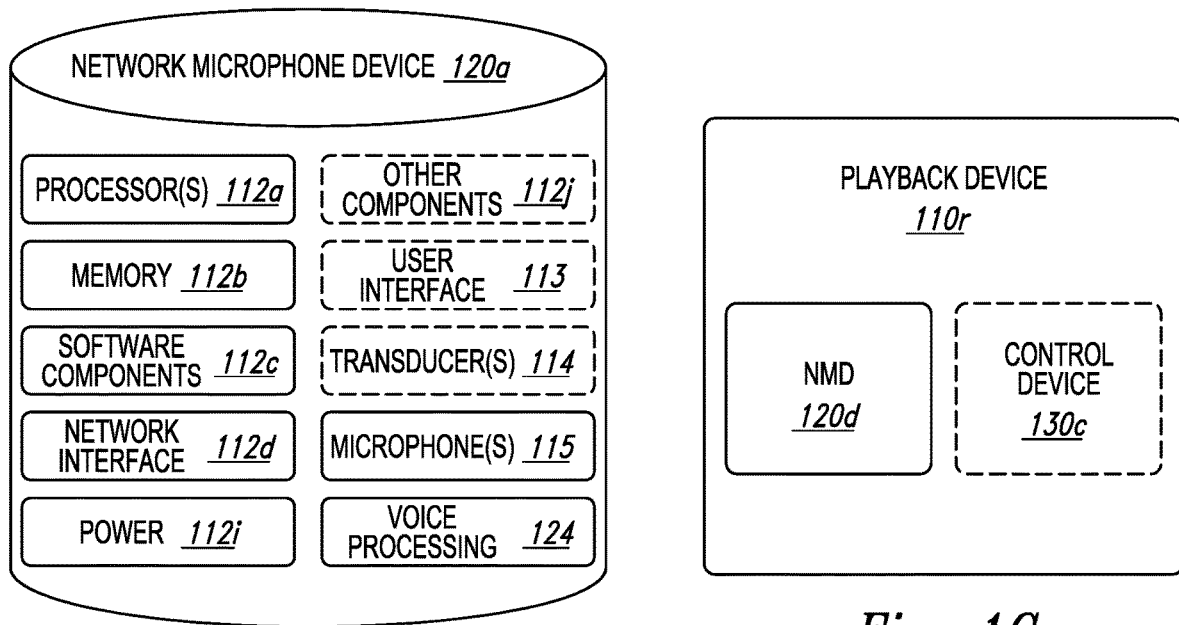
Fig. 1F
Fig. 1G
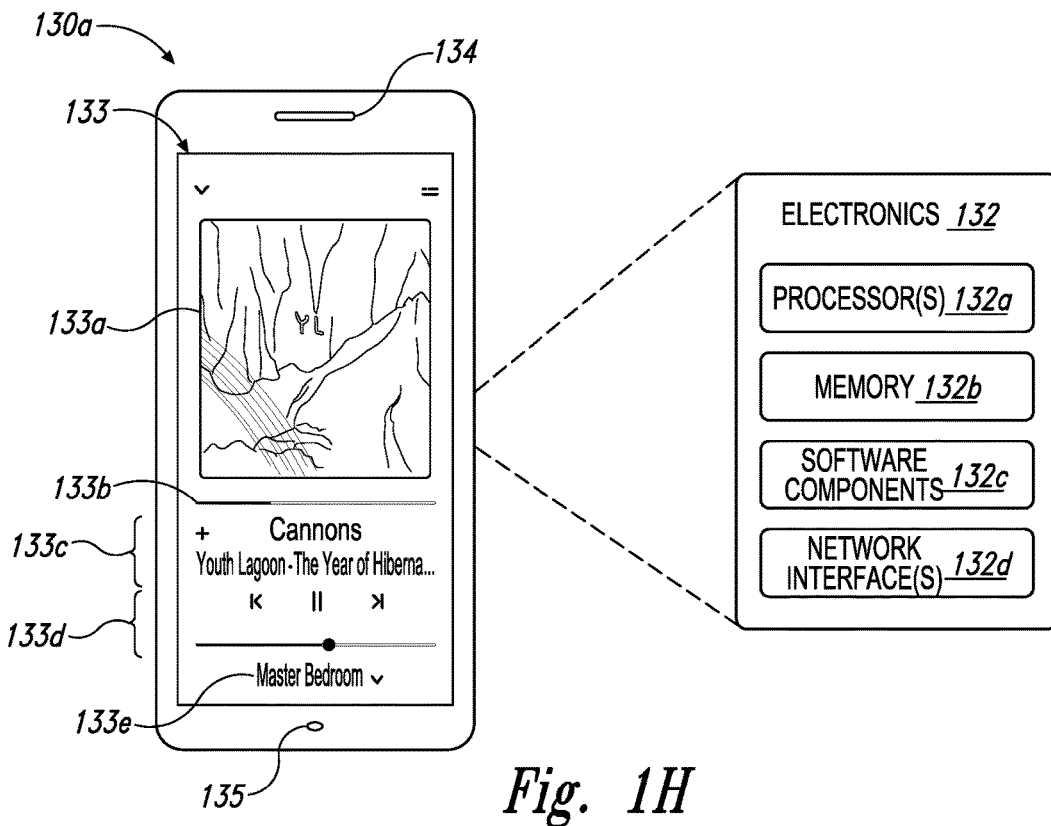
Fig. 1H

— MEDIA CONTENT BASED ON OPERATIONAL DATA

FIELD OF THE DISCLOSURE

The present disclosure is related to consumer goods and, more particularly, to methods, systems, products, features, services, and other elements directed to media playback or some aspect thereof.

BACKGROUND

Options for accessing and listening to digital audio in an out-loud setting were limited until in 2002, when SONOS, Inc. began development of a new type of playback system. Sonos then filed one of its first patent applications in 2003, entitled "Method for Synchronizing Audio Playback between Multiple Networked Devices," and began offering its first media playback systems for sale in 2005. The Sonos Wireless Home Sound System enables people to experience music from many sources via one or more networked playback devices. Through a software control application installed on a controller (e.g., smartphone, tablet, computer, voice input device), one can play what she wants in any room having a networked playback device. Media content (e.g., songs, podcasts, video sound) can be streamed to playback devices such that each room with a playback device can play back corresponding different media content. In addition, rooms can be grouped together for synchronous playback of the same media content, and/or the same media content can be heard in all rooms synchronously.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible.

Figure 1A:
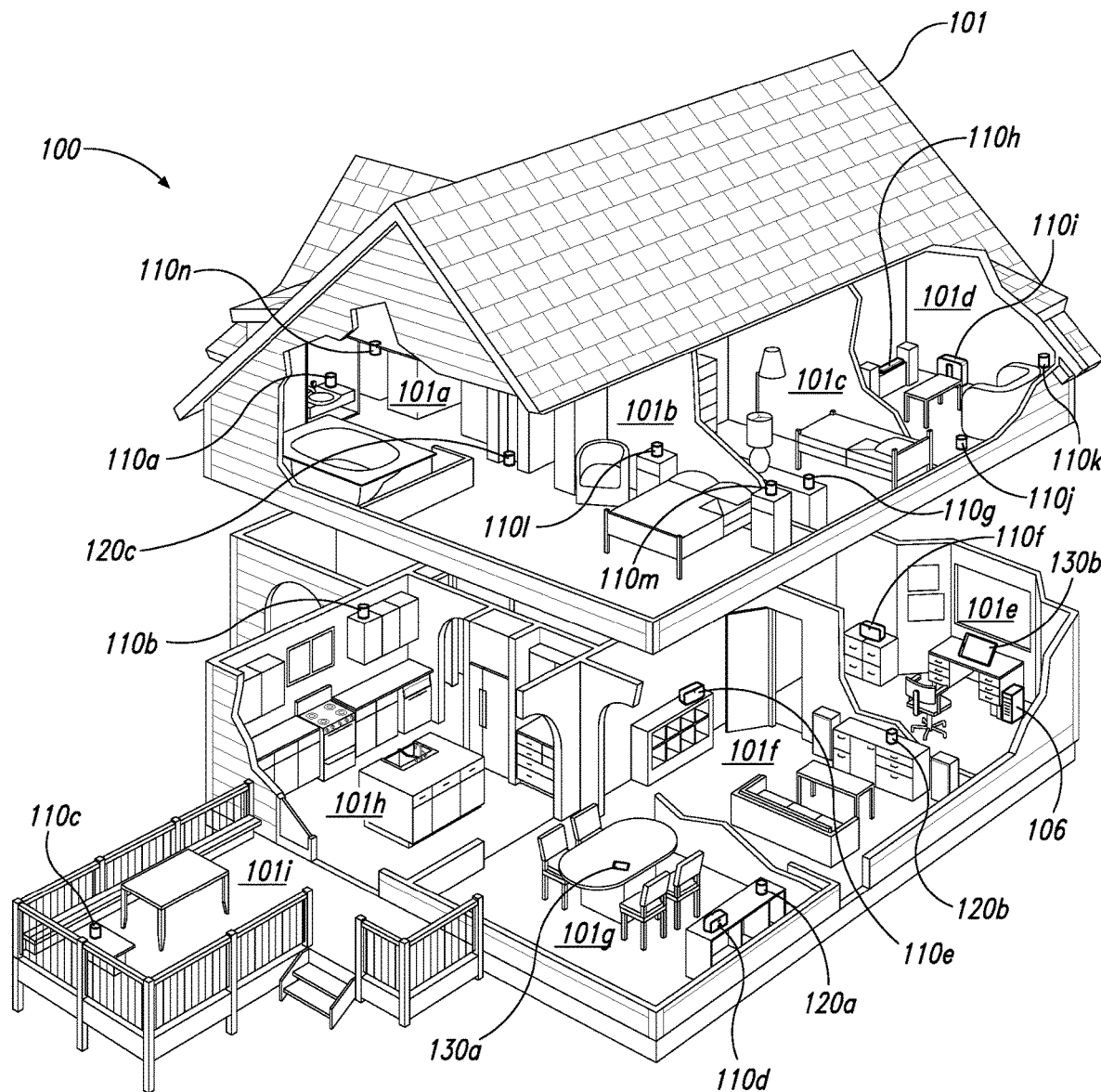
FIG. 1A is a partial cutaway view of an environment having a media playback system configured in accordance with aspects of the disclosed technology.

The drawings are for the purpose of illustrating example embodiments, but those of ordinary skill in the art will understand that the technology disclosed herein is not limited to the arrangements and/or instrumentality shown in the drawings.

DETAILED DESCRIPTION

I. Overview

Embodiments described herein relate to creating and offering content to users of a media playback system based on operational data obtained from the media playback system. The content may include playlists, internet radio stations, podcasts, and the like that correspond to a user's interests, as well as advertisements that are relevant to a given user or users of the media playback system where the content is being played.

Traditionally, terrestrial radio programming has been assembled based on a given genre of content (e.g., a classic rock station or R&B music station). Advertisers can then target their ads to be played during a terrestrial radio broadcast based on the given genre, which can provide some demographic information about potential listeners, and the time of day. However, other than these two data points, there is little information available about potential listeners, including what their other interests might be, where they might be located (e.g., in a car, at work, at home), or indeed, whether and how many people are listening at all.

On the other hand, in a networked media playback system of the type discussed herein, much more operational data is available for use in the creation of content. The operational data used to create such content may be wide-ranging, including, for example, the listening habits and media preferences of one or more users of the media playback system, data related to the media playback system itself, and in some cases, an approximation of a user's location in their media playback system when they are experiencing the content, among other possibilities.

For example, a media playback system provider, such as Sonos or a similarly situated provider, may curate a set of internet radio stations based not only on genres of music as discussed above, but on more granular preferences that may be obtained from across the numerous media playback system that are in operation. For example, the provider may be able to discern that there is a significant cohort of country music listeners who prefer country music from a particular timeframe (e.g., 80s country) and dislike country music from another particular timeframe, or perhaps dislike other classifications of country music. This data may be based on, for instance, users entering preference information (e.g., a thumbs up/down or a like/dislike) via a control application while listening to media content in their media playback system. Accordingly, the provider may curate an internet radio station based on this data and then provide a listening suggestion, via an indication in the control application, for example, to any users whose preferences match those on which the station is based. Other information, if known, such as a user's age or geographic location, might provide additional data that correlates with media content preferences, and may contribute to the creation and offering of content.

In some implementations, the operational data may include data related to the number, model, and configuration of playback devices included in the user's media playback system. This data may be used by the media playback system provider to provide, within the curated internet radio programming discussed above, targeted ads that promote the expansion or improvement of the user's system. For example, a user in a media playback system that includes only one playback device may receive advertisements related to multi-room, synchronous playback between two or more devices, or the benefits of creating a bonded, multi-channel grouping of playback devices (e.g., a stereo pair or home theater configuration). Similarly, a user who has never calibrated their playback device(s) may receive an advertisement notifying the user that such calibration functionality is available, suggesting its benefits, and explaining how to access it via a control application on the user's smartphone, for instance. In this regard, any of the advertisements discussed herein may be accompanied by a selectable indication that is displayed via the control application while the advertisement plays on a given playback device. The selectable indication may include a link that directs a user to purchase or obtain more information about an advertised product. Other examples are also possible.

Similar to the configuration data related to the playback devices in the media playback system, the operational data discussed herein may include information related to the media content sources that are available to the media playback system. For example, a user of the media playback system may have a subscription to, and thus a user account associated with, one or more cloud-based media content sources that provide media content that is playable via the playback devices of the media playback system. However, an internet radio program curated by the media playback system provider might include songs and other audio tracks that are not normally available from any of the user's subscribed media content sources. Thus, after a song plays that the user does not normally have access to, a targeted advertisement for a given media content source that includes the song in question might be provided.

Other types of operational data may provide an indication of user presence within the media playback system. For example, any actions taken via a control application, such as the initiation of playback, volume commands, grouping and ungrouping of playback devices, or simply browsing additional media content may indicate that a user is present in the media playback system and very likely to be listening to the internet radio station and any associated advertisements. Accordingly, an advertising time slot with this type of verifiable audience may be more valuable to advertisers.

Other indications of user presence within a media playback system are also possible. As discussed herein, one or more networked microphone devices (NMDs) may be included within the networked media playback system. For example, a NMD maybe be incorporated into a given playback device and may receive media playback and other voice commands from a user after one or more activation words (e.g., wake words) are detected. Accordingly, a voice command received via a NMD within the media playback system may reliably indicate that a user is present. Situations in which the NMD detects speech, but does not detect any activation words, may also imply user presence within the media playback system.

As yet another example, one or more playback devices of a networked media playback system may receive an indication of attenuation of network traffic on the media playback system's local area network (LAN). For instance, one or more playback devices may be equipped to monitor network traffic over the LAN for the purpose of maintaining high quality audio playback, and may adjust the network topology among playback devices or modify audio content based on such information, if necessary. If network attenuation is detected, it may indicate that a user is present within the media playback system, utilizing another device that is affecting the LAN. For example, streaming ultra-high definition video content over the LAN may have an appreciable impact on the network. Other examples are also possible.

Moreover, some indications of user presence within the media playback system may be tied to a particular user. For instance, where there are multiple users of a given media playback system, each user may have a registered user account with the media playback system provider and their own corresponding control application installed on their device of choice, such as a smartphone. Thus, control activity can be tied to a given device on which it was received, which is associated with a given user account. Accordingly, any user profile information that the user has elected to populate their account with (e.g., gender, age/generation, other interests, etc.) may be used as a basis to provide targeted advertisements. Further, a user's profile may include information regarding their particular media preferences and listening history, which may be different from other users in the same media playback system.

In some implementations, the names corresponding to the playback devices in a media playback system may be used as a reliable proxy for a given playback device's location in a user's household. For instance, a playback device given the name "Kitchen" likely resides in a location in the user's household where cooking and food preparation occurs. Accordingly, the media playback system provider may insert, into the internet radio programming that is being played back by the Kitchen playback device, targeted ads that are associated with cooking, groceries, and the like.

Other advertisements that are targeted based on a playback device's name, and a user activity that is likely to be correlated with the name, are also possible. Fitness and exercise related advertisements may be provided to a playback device named "Workout Room," for example. In some cases, the naming of a new playback device or the renaming of an existing playback device may be informative operational data that is useful for all playback devices in a media playback system. For example, if a new playback device is added to a media playback system and named "Nursery" or "Baby's Room," it may indicate that targeted ads for baby products are now desirable on some or all playback devices in that media playback system.

Based on the operational data discussed above, it may be possible for different playback devices in the media playback system that are playing back the same internet radio station to nonetheless receive and playback different advertisements during a given advertising time slot. For example, the Kitchen playback device discussed above and a second playback device designated as "Master Bathroom" may be grouped for synchronous playback of a given internet radio station in the morning. When the programming reaches an advertising time slot, the Kitchen playback device may receive and play back an advertisement related to kitchen appliances or grocery shopping, while the Master Bathroom playback device may receive and play back an advertisement related to hygiene or beauty care products. Either or both of the advertisements might be further refined based on other operational data that might be available.

Further, the ability to provide different advertisements to different playback devices that are playing the same internet radio content might also include the possibility of advertisements being withheld from certain playback devices. For instance, a playback device named "Nursery" that is playing an internet radio station of instrumental music during the middle of the day, at a relatively low volume, may be indicative of a baby's nap time. Accordingly, the Nursery playback device may be silent during designated advertising time slots, or may play back predetermined audio content (e.g., rain sounds) in lieu of targeted advertisements.

As another example, an advertiser might be interested in minimizing the number of "wasted" advertising impressions that are played back if the operational data from the media playback system indicates a low likelihood that a user (or a user fitting a targeted demographic) is present in a given playback zone. For example, an advertising impression may be far more lucrative to a given advertiser of kitchen products if it is played via the playback device designated as Kitchen, between the hours of 4 pm and 6 pm when meal preparation may be likely, and shortly after a volume manipulation has been detected at a given user's control device, indicating user presence. Numerous other examples are also possible.

Although the internet radio content contemplated herein is not a "broadcast" as that word is used to describe terrestrial radio transmission, it may nevertheless operate according to a fixed, linear programming schedule. For example, a given internet radio station will provide the same playlist of media items to any playback devices that have requested to play back the internet radio programming, such that the content is played in substantial synchrony between the playback devices. For example, a computing system, which may contain one or more computing devices and/or cloud servers, may maintain a playlist of media items in a queue for playback, along with an indication of a current playback position within the playlist, which is always advancing. When the computing system receives a request from a given playback device to "tune in" to the internet radio station and thereby begin playback, the computing system provides the playback device one or more media items from the playlist, beginning with the then-current media item. In some cases, the computing system may only provide a fragment of the current media item, beginning from the audio frame corresponding to the current playback position.

As playback continues, the computing system may determine respective advertisements based on operational data that it receives from each playback device, and may provide the advertisements for playback to each respective playback device during the corresponding advertising time slot.

The level of synchrony that the computing system may provide between playback devices in separate media playback systems, in separate households, is less rigorous than that required of multiple playback devices in the same media playback system (e.g., in the same room) that are grouped for synchronous playback. For instance, the synchronous playback of internet radio content among playback devices within the same media playback system may be handled by one or more local playback devices acting as a group coordinator, according to known methods. Of course, transport controls (e.g., pause, skip, etc.) are not available when listening to such an internet radio stream.

In another embodiment, the media service provider discussed herein may access one or more terrestrial radio stream aggregation services and thereby provide access to streaming versions of traditional broadcast radio content. In this arrangement, the advertisements included within the audio programming will typically be those that are transmitted by, and would otherwise by heard on, the local terrestrial radio broadcast. However, it is also contemplated that the computing system discussed above may be capable of identifying the advertisements in a terrestrial radio stream and then replacing the native advertisements with the more targeted advertising discussed herein.

As noted above, embodiments described herein relate to creating and offering content to users of a media playback system based on operational data obtained from the media playback system. In some embodiments, for example, a computing system is provided including at least one processor, a non-transitory computer-readable medium, and program instructions stored on the non-transitory computer-readable medium that, when executed by the at least one processor, cause the computing system to perform functions including (i) maintaining a playlist of media items for playback by one or more playback devices, where the playlist of media items includes a plurality of time slots designated for advertisements; (ii) receiving, from a first playback device, (a) a first request to play back the playlist of media items and (b) first operational data corresponding to the first playback device; (iii) receiving, from a second playback device, (a) a second request to play back the playlist of media items and (b) second operational data corresponding to the second playback device; (iv) determining, based on the first operational data corresponding to the first playback device, a first advertisement to be provided to the first playback device; (v) determining, based on the second operational data corresponding to the second playback device, a second advertisement to be provided to the second playback device; (vi) based on the first request and the second request, providing one or more media items in the playlist to the first playback device and the second playback device for substantially synchronous playback by the first playback device and the second playback device; (vii) providing the first advertisement to the first playback device for playback during the given time slot; and (viii) providing the second advertisement to the second playback device for playback during the given time slot, such that the second playback device plays the second advertisement while the first playback device plays the first advertisement.

While some examples described herein may refer to functions performed by given actors such as "users," "listeners," and/or other entities, it should be understood that this is for purposes of explanation only. The claims should not be interpreted to require action by any such example actor unless explicitly required by the language of the claims themselves.

In the Figures, identical reference numbers identify generally similar, and/or identical, elements. To facilitate the discussion of any particular element, the most significant digit or digits of a reference number refers to the Figure in which that element is first introduced. For example, element 110a is first introduced and discussed with reference to FIG.

1A. Many of the details, dimensions, angles and other features shown in the Figures are merely illustrative of particular embodiments of the disclosed technology. Accordingly, other embodiments can have other details, dimensions, angles and features without departing from the spirit or scope of the disclosure. In addition, those of ordinary skill in the art will appreciate that further embodiments of the various disclosed technologies can be practiced without several of the details described below.

II. Suitable Operating Environment

FIG. 1A is a partial cutaway view of a media playback system 100 distributed in an environment 101 (e.g., a house). The media playback system 100 comprises one or more playback devices 110 (identified individually as playback devices 110a-n), one or more network microphone devices ("NMDs"), 120 (identified individually as NMDs 120a-c), and one or more control devices 130 (identified individually as control devices 130a and 130b).

As used herein the term "playback device" can generally refer to a network device configured to receive, process, and output data of a media playback system. For example, a playback device can be a network device that receives and processes audio content. In some embodiments, a playback device includes one or more transducers or speakers powered by one or more amplifiers. In other embodiments, however, a playback device includes one of (or neither of) the speaker and the amplifier. For instance, a playback device can comprise one or more amplifiers configured to drive one or more speakers external to the playback device via a corresponding wire or cable.

Moreover, as used herein the term NMD (i.e., a "network microphone device") can generally refer to a network device that is configured for audio detection. In some embodiments, an NMD is a stand-alone device configured primarily for audio detection. In other embodiments, an NMD is incorporated into a playback device (or vice versa).

The term "control device" can generally refer to a network device configured to perform functions relevant to facilitating user access, control, and/or configuration of the media playback system 100.

Each of the playback devices 110 is configured to receive audio signals or data from one or more media sources (e.g., one or more remote servers, one or more local devices) and play back the received audio signals or data as sound. The one or more NMDs 120 are configured to receive spoken word commands, and the one or more control devices 130 are configured to receive user input. In response to the received spoken word commands and/or user input, the media playback system 100 can play back audio via one or more of the playback devices 110. In certain embodiments, the playback devices 110 are configured to commence playback of media content in response to a trigger. For instance, one or more of the playback devices 110 can be configured to play back a morning playlist upon detection of an associated trigger condition (e.g., presence of a user in a kitchen, detection of a coffee machine operation). In some embodiments, for example, the media playback system 100 is configured to play back audio from a first playback device (e.g., the playback device 100a) in synchrony with a second playback device (e.g., the playback device 100b). Interactions between the playback devices 110, NMDs 120, and/or control devices 130 of the media playback system 100 configured in accordance with the various embodiments of the disclosure are described in greater detail below with respect to FIGS. 1B-8.

In the illustrated embodiment of FIG. 1A, the environment 101 comprises a household having several rooms, spaces, and/or playback zones, including (clockwise from upper left) a master bathroom 101a, a master bedroom 101b, a second bedroom 101c, a family room or den 101d, an office 101e, a living room 101f, a dining room 101g, a kitchen 101h, and an outdoor patio 101i. While certain embodiments and examples are described below in the context of a home environment, the technologies described herein may be implemented in other types of environments. In some embodiments, for example, the media playback system 100 can be implemented in one or more commercial settings (e.g., a restaurant, mall, airport, hotel, a retail or other store), one or more vehicles (e.g., a sports utility vehicle, bus, car, a ship, a boat, an airplane), multiple environments (e.g., a combination of home and vehicle environments), and/or another suitable environment where multi-zone audio may be desirable.

The media playback system 100 can comprise one or more playback zones, some of which may correspond to the rooms in the environment 101. The media playback system 100 can be established with one or more playback zones, after which additional zones may be added, or removed to form, for example, the configuration shown in FIG. 1A. Each zone may be given a name according to a different room or space such as the office 101e, master bathroom 101a, master bedroom 101b, the second bedroom 101c, kitchen 101h, dining room 101g, living room 101f, and/or the balcony 101i. In some aspects, a single playback zone may include multiple rooms or spaces. In certain aspects, a single room or space may include multiple playback zones.

In the illustrated embodiment of FIG. 1A, the master bathroom 101a, the second bedroom 101c, the office 101e, the living room 101f, the dining room 101g, the kitchen 101h, and the outdoor patio 101i each include one playback device 110, and the master bedroom 101b and the den 101d include a plurality of playback devices 110. In the master bedroom 101b, the playback devices 110l and 110m may be configured, for example, to play back audio content in synchrony as individual ones of playback devices 110, as a bonded playback zone, as a consolidated playback device, and/or any combination thereof. Similarly, in the den 101d, the playback devices 110h-j can be configured, for instance, to play back audio content in synchrony as individual ones of playback devices 110, as one or more bonded playback devices, and/or as one or more consolidated playback devices. Additional details regarding bonded and consolidated playback devices are described below with respect to FIGS. 1B, 1E, and 1I-1M.

In some aspects, one or more of the playback zones in the environment 101 may each be playing different audio content. For instance, a user may be grilling on the patio 101i and listening to hip hop music being played by the playback device 110c while another user is preparing food in the kitchen 101h and listening to classical music played by the playback device 110b. In another example, a playback zone may play the same audio content in synchrony with another playback zone. For instance, the user may be in the office 101e listening to the playback device 110f playing back the same hip hop music being played back by playback device 110c on the patio 101i. In some aspects, the playback devices 110c and 110f play back the hip hop music in synchrony such that the user perceives that the audio content is being played seamlessly (or at least substantially seamlessly) while moving between different playback zones. Additional details regarding audio playback synchronization among playback devices and/or zones can be found, for example, in U.S. Pat. No. 8,234,395 entitled, "System and method for synchronizing operations among a plurality of independently clocked digital data processing devices," which is incorporated herein by reference in its entirety.

a. Suitable Media Playback System

Figure 1B:
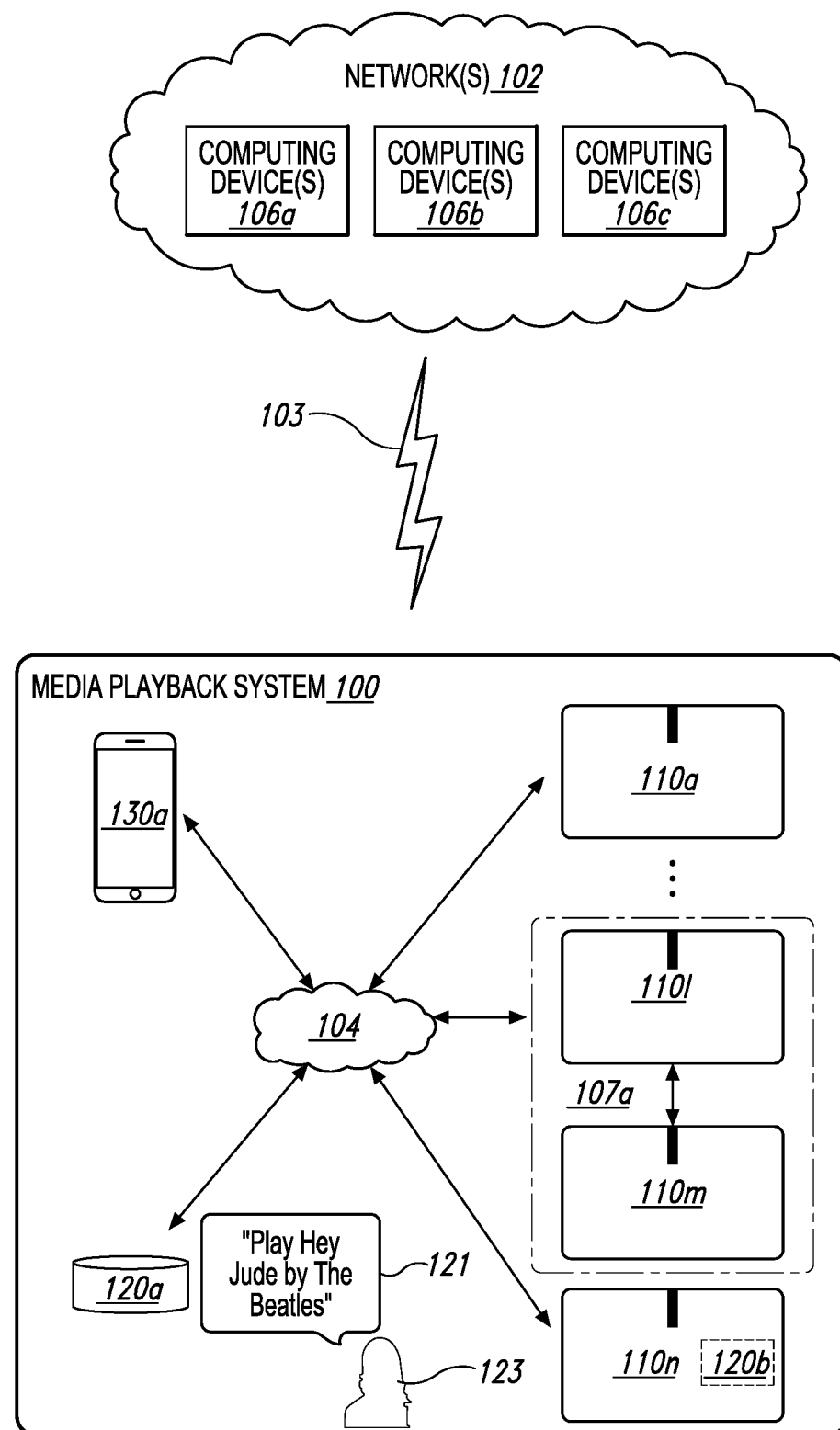
FIG. 1B is a schematic diagram of the media playback system of FIG. 1A and one or more networks.

FIG. 1B is a schematic diagram of the media playback system 100 and a cloud network 102. For ease of illustration, certain devices of the media playback system 100 and the cloud network 102 are omitted from FIG. 1B. One or more communication links 103 (referred to hereinafter as "the links 103") communicatively couple the media playback system 100 and the cloud network 102.

The links 103 can comprise, for example, one or more wired networks, one or more wireless networks, one or more wide area networks (WAN), one or more local area networks (LAN), one or more personal area networks (PAN), one or more telecommunication networks (e.g., one or more Global System for Mobiles (GSM) networks, Code Division Multiple Access (CDMA) networks, Long-Term Evolution (LTE) networks, 5G communication network networks, and/or other suitable data transmission protocol networks), etc. The cloud network 102 is configured to deliver media content (e.g., audio content, video content, photographs, social media content) to the media playback system 100 in response to a request transmitted from the media playback system 100 via the links 103. In some embodiments, the cloud network 102 is further configured to receive data (e.g. voice input data) from the media playback system 100 and correspondingly transmit commands and/or media content to the media playback system 100.

The cloud network 102 comprises computing devices 106 (identified separately as a first computing device 106a, a second computing device 106b, and a third computing device 106c). The computing devices 106 can comprise individual computers or servers, such as, for example, a media streaming service server storing audio and/or other media content, a voice service server, a social media server, a media playback system control server, etc. In some embodiments, one or more of the computing devices 106 comprise modules of a single computer or server. In certain embodiments, one or more of the computing devices 106 comprise one or more modules, computers, and/or servers. Moreover, while the cloud network 102 is described above in the context of a single cloud network, in some embodiments the cloud network 102 comprises a plurality of cloud networks comprising communicatively coupled computing devices. Furthermore, while the cloud network 102 is shown in FIG. 1B as having three of the computing devices 106, in some embodiments, the cloud network 102 comprises fewer (or more than) three computing devices 106.

The media playback system 100 is configured to receive media content from the networks 102 via the links 103. The received media content can comprise, for example, a Uniform Resource Identifier (URI) and/or a Uniform Resource Locator (URL). For instance, in some examples, the media playback system 100 can stream, download, or otherwise obtain data from a URI or a URL corresponding to the received media content. A network 104 communicatively couples the links 103 and at least a portion of the devices (e.g., one or more of the playback devices 110, NMDs 120, and/or control devices 130) of the media playback system 100. The network 104 can include, for example, a wireless network (e.g., a WiFi network, a Bluetooth, a Z-Wave network, a ZigBee, and/or other suitable wireless communication protocol network) and/or a wired network (e.g., a network comprising Ethernet, Universal Serial Bus (USB), and/or another suitable wired communication). As those of ordinary skill in the art will appreciate, as used herein, "WiFi" can refer to several different communication protocols including, for example, Institute of Electrical and Electronics Engineers (IEEE) 802.11a, 802.11b, 802.11g, 802.11n, 802.11ac, 802.11ac, 802.11ad, 802.11af, 802.11ah, 802.11ai, 802.11aj, 802.11aq, 802.11ax, 802.11ay, 802.15, etc. transmitted at 2.4 Gigahertz (GHz), 5 GHz, and/or another suitable frequency.

In some embodiments, the network 104 comprises a dedicated communication network that the media playback system 100 uses to transmit messages between individual devices and/or to transmit media content to and from media content sources (e.g., one or more of the computing devices 106). In certain embodiments, the network 104 is configured to be accessible only to devices in the media playback system 100, thereby reducing interference and competition with other household devices. In other embodiments, however, the network 104 comprises an existing household communication network (e.g., a household WiFi network). In some embodiments, the links 103 and the network 104 comprise one or more of the same networks. In some aspects, for example, the links 103 and the network 104 comprise a telecommunication network (e.g., an LTE network, a 5G network). Moreover, in some embodiments, the media playback system 100 is implemented without the network 104, and devices comprising the media playback system 100 can communicate with each other, for example, via one or more direct connections, PANs, telecommunication networks, and/or other suitable communication links.

In some embodiments, audio content sources may be regularly added or removed from the media playback system 100. In some embodiments, for example, the media playback system 100 performs an indexing of media items when one or more media content sources are updated, added to, and/or removed from the media playback system 100. The media playback system 100 can scan identifiable media items in some or all folders and/or directories accessible to the playback devices 110, and generate or update a media content database comprising metadata (e.g., title, artist, album, track length) and other associated information (e.g., URIs, URLs) for each identifiable media item found. In some embodiments, for example, the media content database is stored on one or more of the playback devices 110, network microphone devices 120, and/or control devices 130.

In the illustrated embodiment of FIG. 1B, the playback devices 110*l* and 110*m* comprise a group 107a. The playback devices 110*l* and 110*m* can be positioned in different rooms in a household and be grouped together in the group 107a on a temporary or permanent basis based on user input received at the control device 130a and/or another control device 130 in the media playback system 100. When arranged in the group 107a, the playback devices 110*l* and 110*m* can be configured to play back the same or similar audio content in synchrony from one or more audio content sources. In certain embodiments, for example, the group 107a comprises a bonded zone in which the playback devices 110*l* and 110*m* comprise left audio and right audio channels, respectively, of multi-channel audio content, thereby producing or enhancing a stereo effect of the audio content. In some embodiments, the group 107a includes additional playback devices 110. In other embodiments, however, the media playback system 100 omits the group 107a and/or other grouped arrangements of the playback devices 110. Additional details regarding groups and other arrangements of playback devices are described in further detail below with respect to FIGS. 1I through 1M.

The media playback system 100 includes the NMDs 120a and 120d, each comprising one or more microphones configured to receive voice utterances from a user. In the illustrated embodiment of FIG. 1B, the NMD 120a is a standalone device and the NMD 120d is integrated into the playback device 110n. The NMD 120a, for example, is configured to receive voice input 121 from a user 123. In some embodiments, the NMD 120a transmits data associated with the received voice input 121 to a voice assistant service (VAS) configured to (i) process the received voice input data and (ii) transmit a corresponding command to the media playback system 100. In some aspects, for example, the computing device 106c comprises one or more modules and/or servers of a VAS (e.g., a VAS operated by one or more of SONOS®, AMAZON®, GOOGLE® APPLE®, MICROSOFT®). The computing device 106c can receive the voice input data from the NMD 120a via the network 104 and the links 103. In response to receiving the voice input data, the computing device 106c processes the voice input data (i.e., "Play Hey Jude by The Beatles"), and determines that the processed voice input includes a command to play a song (e.g., "Hey Jude"). The computing device 106c accordingly transmits commands to the media playback system 100 to play back "Hey Jude" by the Beatles from a suitable media service (e.g., via one or more of the computing devices 106) on one or more of the playback devices 110.

b. Suitable Playback Devices

Figure 1C:
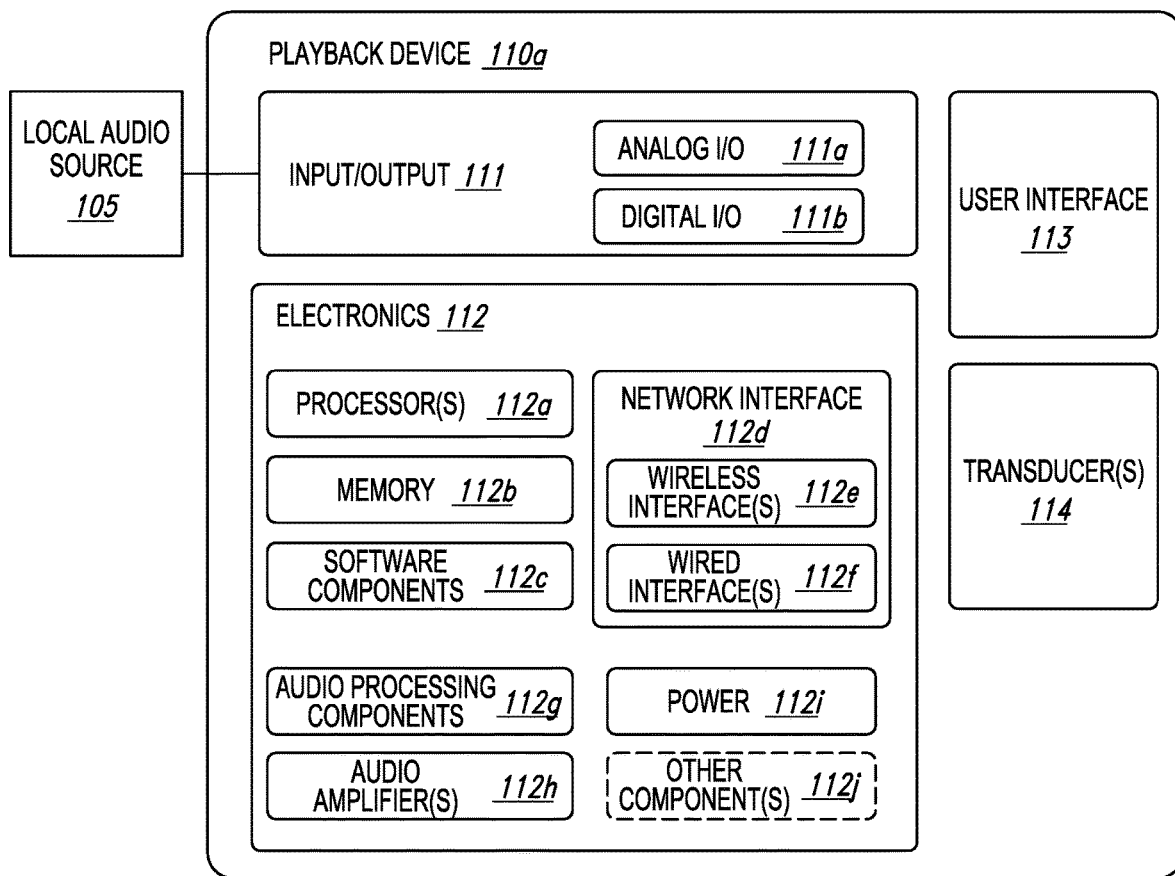
FIG. 1C is a block diagram of a playback device.

FIG. 1C is a block diagram of the playback device 110a comprising an input/output 111. The input/output 111 can include an analog I/O 111a (e.g., one or more wires, cables, and/or other suitable communication links configured to carry analog signals) and/or a digital I/O 111b (e.g., one or more wires, cables, or other suitable communication links configured to carry digital signals). In some embodiments, the analog I/O 111a is an audio line-in input connection comprising, for example, an auto-detecting 3.5 mm audio line-in connection. In some embodiments, the digital I/O 111b comprises a Sony/Philips Digital Interface Format (S/PDIF) communication interface and/or cable and/or a Toshiba Link (TOSLINK) cable. In some embodiments, the digital I/O 111b comprises an High-Definition Multimedia Interface (HDMI) interface and/or cable. In some embodiments, the digital I/O 111b includes one or more wireless communication links comprising, for example, a radio frequency (RF), infrared, WiFi, Bluetooth, or another suitable communication protocol. In certain embodiments, the analog I/O 111a and the digital 111b comprise interfaces (e.g., ports, plugs, jacks) configured to receive connectors of cables transmitting analog and digital signals, respectively, without necessarily including cables.

The playback device 110a, for example, can receive media content (e.g., audio content comprising music and/or other sounds) from a local audio source 105 via the input/output 111 (e.g., a cable, a wire, a PAN, a Bluetooth connection, an ad hoc wired or wireless communication network, and/or another suitable communication link). The local audio source 105 can comprise, for example, a mobile device (e.g., a smartphone, a tablet, a laptop computer) or another suitable audio component (e.g., a television, a desktop computer, an amplifier, a phonograph, a Blu-ray player, a memory storing digital media files). In some aspects, the local audio source 105 includes local music libraries on a smartphone, a computer, a networked-attached storage (NAS), and/or another suitable device configured to store media files. In certain embodiments, one or more of the playback devices 110, NMDs 120, and/or control devices 130 comprise the local audio source 105. In other embodiments, however, the media playback system omits the local audio source 105 altogether. In some embodiments, the playback device 110a does not include an input/output 111 and receives all audio content via the network 104.

The playback device 110a further comprises electronics 112, a user interface 113 (e.g., one or more buttons, knobs, dials, touch-sensitive surfaces, displays, touchscreens), and one or more transducers 114 (referred to hereinafter as "the transducers 114"). The electronics 112 is configured to receive audio from an audio source (e.g., the local audio source 105) via the input/output 111, one or more of the computing devices 106a-c via the network 104 (FIG. 1B)), amplify the received audio, and output the amplified audio for playback via one or more of the transducers 114. In some embodiments, the playback device 110a optionally includes one or more microphones 115 (e.g., a single microphone, a plurality of microphones, a microphone array) (hereinafter referred to as "the microphones 115"). In certain embodiments, for example, the playback device 110a having one or more of the optional microphones 115 can operate as an NMD configured to receive voice input from a user and correspondingly perform one or more operations based on the received voice input.

In the illustrated embodiment of FIG. 1C, the electronics 112 comprise one or more processors 112a (referred to hereinafter as "the processors 112a"), memory 112b, software components 112c, a network interface 112d, one or more audio processing components 112g (referred to hereinafter as "the audio components 112g"), one or more audio amplifiers 112h (referred to hereinafter as "the amplifiers 112h"), and power 112i (e.g., one or more power supplies, power cables, power receptacles, batteries, induction coils, Power-over Ethernet (POE) interfaces, and/or other suitable sources of electric power). In some embodiments, the electronics 112 optionally include one or more other components 112j (e.g., one or more sensors, video displays, touchscreens, battery charging bases).

The processors 112a can comprise clock-driven computing component(s) configured to process data, and the memory 112b can comprise a computer-readable medium (e.g., a tangible, non-transitory computer-readable medium, data storage loaded with one or more of the software components 112c) configured to store instructions for performing various operations and/or functions. The processors 112a are configured to execute the instructions stored on the memory 112b to perform one or more of the operations. The operations can include, for example, causing the playback device 110a to retrieve audio data from an audio source (e.g., one or more of the computing devices 106a-c (FIG. 1B)), and/or another one of the playback devices 110. In some embodiments, the operations further include causing the playback device 110a to send audio data to another one of the playback devices 110a and/or another device (e.g., one of the NMDs 120). Certain embodiments include operations causing the playback device 110a to pair with another of the one or more playback devices 110 to enable a multi-channel audio environment (e.g., a stereo pair, a bonded zone).

The processors 112a can be further configured to perform operations causing the playback device 110a to synchronize playback of audio content with another of the one or more playback devices 110. As those of ordinary skill in the art will appreciate, during synchronous playback of audio content on a plurality of playback devices, a listener will preferably be unable to perceive time-delay differences between playback of the audio content by the playback device 110a and the other one or more other playback devices 110. Additional details regarding audio playback synchronization among playback devices can be found, for example, in U.S. Pat. No. 8,234,395, which was incorporated by reference above.

In some embodiments, the memory 112b is further configured to store data associated with the playback device 110a, such as one or more zones and/or zone groups of which the playback device 110a is a member, audio sources accessible to the playback device 110a, and/or a playback queue that the playback device 110a (and/or another of the one or more playback devices) can be associated with. The stored data can comprise one or more state variables that are periodically updated and used to describe a state of the playback device 110a. The memory 112b can also include data associated with a state of one or more of the other devices (e.g., the playback devices 110, NMDs 120, control devices 130) of the media playback system 100. In some aspects, for example, the state data is shared during predetermined intervals of time (e.g., every 5 seconds, every 10 seconds, every 60 seconds) among at least a portion of the devices of the media playback system 100, so that one or more of the devices have the most recent data associated with the media playback system 100.

The network interface 112d is configured to facilitate a transmission of data between the playback device 110a and one or more other devices on a data network such as, for example, the links 103 and/or the network 104 (FIG. 1B). The network interface 112d is configured to transmit and receive data corresponding to media content (e.g., audio content, video content, text, photographs) and other signals (e.g., non-transitory signals) comprising digital packet data including an Internet Protocol (IP)-based source address and/or an IP-based destination address. The network interface 112d can parse the digital packet data such that the electronics 112 properly receives and processes the data destined for the playback device 110a.

In the illustrated embodiment of FIG. 1C, the network interface 112d comprises one or more wireless interfaces 112e (referred to hereinafter as "the wireless interface 112e"). The wireless interface 112e (e.g., a suitable interface comprising one or more antennae) can be configured to wirelessly communicate with one or more other devices (e.g., one or more of the other playback devices 110, NMDs 120, and/or control devices 130) that are communicatively coupled to the network 104 (FIG. 1B) in accordance with a suitable wireless communication protocol (e.g., WiFi, Bluetooth, LTE). In some embodiments, the network interface 112d optionally includes a wired interface 112f (e.g., an interface or receptacle configured to receive a network cable such as an Ethernet, a USB-A, USB-C, and/or Thunderbolt cable) configured to communicate over a wired connection with other devices in accordance with a suitable wired communication protocol. In certain embodiments, the network interface 112d includes the wired interface 112f and excludes the wireless interface 112e. In some embodiments, the electronics 112 excludes the network interface 112d altogether and transmits and receives media content and/or other data via another communication path (e.g., the input/output 111).

The audio components 112g are configured to process and/or filter data comprising media content received by the electronics 112 (e.g., via the input/output 111 and/or the network interface 112d) to produce output audio signals. In some embodiments, the audio processing components 112g comprise, for example, one or more digital-to-analog converters (DAC), audio preprocessing components, audio enhancement components, a digital signal processors (DSPs), and/or other suitable audio processing components, modules, circuits, etc. In certain embodiments, one or more of the audio processing components 112g can comprise one or more subcomponents of the processors 112a. In some embodiments, the electronics 112 omits the audio processing components 112g. In some aspects, for example, the processors 112a execute instructions stored on the memory 112b to perform audio processing operations to produce the output audio signals.

The amplifiers 112h are configured to receive and amplify the audio output signals produced by the audio processing components 112g and/or the processors 112a. The amplifiers 112h can comprise electronic devices and/or components configured to amplify audio signals to levels sufficient for driving one or more of the transducers 114. In some embodiments, for example, the amplifiers 112h include one or more switching or class-D power amplifiers. In other embodiments, however, the amplifiers include one or more other types of power amplifiers (e.g., linear gain power amplifiers, class-A amplifiers, class-B amplifiers, class-AB amplifiers, class-C amplifiers, class-D amplifiers, class-E amplifiers, class-F amplifiers, class-G and/or class H amplifiers, and/or another suitable type of power amplifier). In certain embodiments, the amplifiers 112h comprise a suitable combination of two or more of the foregoing types of power amplifiers. Moreover, in some embodiments, individual ones of the amplifiers 112h correspond to individual ones of the transducers 114. In other embodiments, however, the electronics 112 includes a single one of the amplifiers 112h configured to output amplified audio signals to a plurality of the transducers 114. In some other embodiments, the electronics 112 omits the amplifiers 112h.

The transducers 114 (e.g., one or more speakers and/or speaker drivers) receive the amplified audio signals from the amplifier 112h and render or output the amplified audio signals as sound (e.g., audible sound waves having a frequency between about 20 Hertz (Hz) and 20 kilohertz (kHz)). In some embodiments, the transducers 114 can comprise a single transducer. In other embodiments, however, the transducers 114 comprise a plurality of audio transducers. In some embodiments, the transducers 114 comprise more than one type of transducer. For example, the transducers 114 can include one or more low frequency transducers (e.g., subwoofers, woofers), mid-range frequency transducers (e.g., mid-range transducers, mid-woofers), and one or more high frequency transducers (e.g., one or more tweeters). As used herein, "low frequency" can generally refer to audible frequencies below about 500 Hz, "mid-range frequency" can generally refer to audible frequencies between about 500 Hz and about 2 kHz, and "high frequency" can generally refer to audible frequencies above 2 kHz. In certain embodiments, however, one or more of the transducers 114 comprise transducers that do not adhere to the foregoing frequency ranges. For example, one of the transducers 114 may comprise a mid-woofer transducer configured to output sound at frequencies between about 200 Hz and about 5 kHz.

Figure 1D:
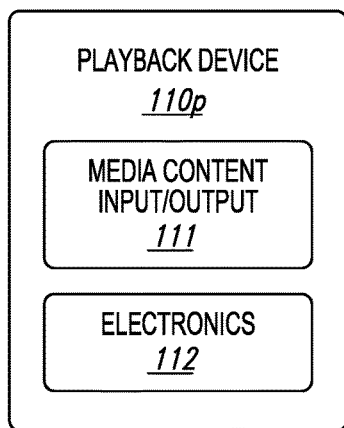
FIG. 1D is a block diagram of a playback device.

By way of illustration, SONOS, Inc. presently offers (or has offered) for sale certain playback devices including, for example, a "SONOS ONE," "PLAY:1," "PLAY:3," "PLAY: 5," "PLAYBAR," "PLAYBASE," "CONNECT:AMP," "CONNECT," and "SUB." Other suitable playback devices may additionally or alternatively be used to implement the playback devices of example embodiments disclosed herein. Additionally, one of ordinary skilled in the art will appreciate that a playback device is not limited to the examples described herein or to SONOS product offerings. In some embodiments, for example, one or more playback devices 110 comprises wired or wireless headphones (e.g., over-the-ear headphones, on-ear headphones, in-ear earphones). In other embodiments, one or more of the playback devices 110 comprise a docking station and/or an interface configured to interact with a docking station for personal mobile media playback devices. In certain embodiments, a playback device may be integral to another device or component such as a television, a lighting fixture, or some other device for indoor or outdoor use. In some embodiments, a playback device omits a user interface and/or one or more transducers. For example, FIG. 1D is a block diagram of a playback device 110p comprising the input/output 111 and electronics 112 without the user interface 113 or transducers 114.

Figure 1E:
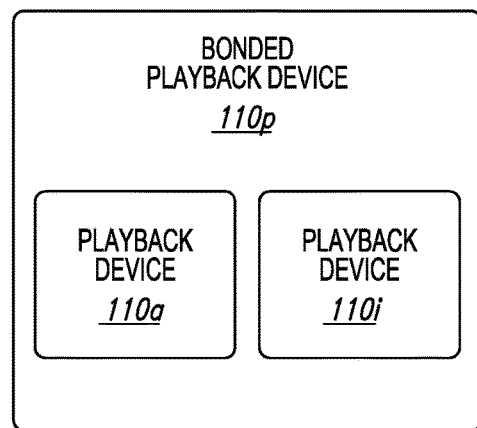
FIG. 1E is a block diagram of a network microphone device.

FIG. 1E is a block diagram of a bonded playback device 110q comprising the playback device 110a (FIG. 1C) sonically bonded with the playback device 110i (e.g., a subwoofer) (FIG. 1A). In the illustrated embodiment, the playback devices 110a and 110i are separate ones of the playback devices 110 housed in separate enclosures. In some embodiments, however, the bonded playback device 110q comprises a single enclosure housing both the playback devices 110a and 110i. The bonded playback device 110q can be configured to process and reproduce sound differently than an unbonded playback device (e.g., the playback device 110a of FIG. 1C) and/or paired or bonded playback devices (e.g., the playback devices 110l and 110m of FIG. 1B). In some embodiments, for example, the playback device 110a is full-range playback device configured to render low frequency, mid-range frequency, and high frequency audio content, and the playback device 110i is a subwoofer configured to render low frequency audio content. In some aspects, the playback device 110a, when bonded with the first playback device, is configured to render only the mid-range and high frequency components of a particular audio content, while the playback device 110i renders the low frequency component of the particular audio content. In some embodiments, the bonded playback device 110q includes additional playback devices and/or another bonded playback device. Additional playback device embodiments are described in further detail below with respect to FIGS. 2A-3D.

c. Suitable Network Microphone Devices (NMDs)

FIG. 1F is a block diagram of the NMD 120a (FIGS. 1A and 1B). The NMD 120a includes one or more voice processing components 124 (hereinafter "the voice components 124") and several components described with respect to the playback device 110a (FIG. 1C) including the processors 112a, the memory 112b, and the microphones 115. The NMD 120a optionally comprises other components also included in the playback device 110a (FIG. 1C), such as the user interface 113 and/or the transducers 114. In some embodiments, the NMD 120a is configured as a media playback device (e.g., one or more of the playback devices 110), and further includes, for example, one or more of the audio components 112g (FIG. 1C), the amplifiers 114, and/or other playback device components. In certain embodiments, the NMD 120a comprises an Internet of Things (IoT) device such as, for example, a thermostat, alarm panel, fire and/or smoke detector, etc. In some embodiments, the NMD 120a comprises the microphones 115, the voice processing 124, and only a portion of the components of the electronics 112 described above with respect to FIG. 1B. In some aspects, for example, the NMD 120a includes the processor 112a and the memory 112b (FIG. 1B), while omitting one or more other components of the electronics 112. In some embodiments, the NMD 120a includes additional components (e.g., one or more sensors, cameras, thermometers, barometers, hygrometers).

In some embodiments, an NMD can be integrated into a playback device. FIG. 1G is a block diagram of a playback device 110r comprising an NMD 120d. The playback device 110r can comprise many or all of the components of the playback device 110a and further include the microphones 115 and voice processing 124 (FIG. 1F). The playback device 110r optionally includes an integrated control device 130c. The control device 130c can comprise, for example, a user interface (e.g., the user interface 113 of FIG. 1B) configured to receive user input (e.g., touch input, voice input) without a separate control device. In other embodiments, however, the playback device 110r receives commands from another control device (e.g., the control device 130a of FIG. 1B). Additional NMD embodiments are described in further detail below with respect to FIGS. 3A-3F.

Referring again to FIG. 1F, the microphones 115 are configured to acquire, capture, and/or receive sound from an environment (e.g., the environment 101 of FIG. 1A) and/or a room in which the NMD 120a is positioned. The received sound can include, for example, vocal utterances, audio played back by the NMD 120a and/or another playback device, background voices, ambient sounds, etc. The microphones 115 convert the received sound into electrical signals to produce microphone data. The voice processing 124 receives and analyzes the microphone data to determine whether a voice input is present in the microphone data. The voice input can comprise, for example, an activation word followed by an utterance including a user request. As those of ordinary skill in the art will appreciate, an activation word is a word or other audio cue that signifying a user voice input. For instance, in querying the AMAZON® VAS, a user might speak the activation word "Alexa." Other examples include "Ok, Google" for invoking the GOOGLE® VAS and "Hey, Siri" for invoking the APPLE® VAS.

After detecting the activation word, voice processing 124 monitors the microphone data for an accompanying user request in the voice input. The user request may include, for example, a command to control a third-party device, such as a thermostat (e.g., NEST® thermostat), an illumination device (e.g., a PHILIPS HUE® lighting device), or a media playback device (e.g., a Sonos® playback device). For example, a user might speak the activation word "Alexa" followed by the utterance "set the thermostat to 68 degrees" to set a temperature in a home (e.g., the environment 101 of FIG. 1A). The user might speak the same activation word followed by the utterance "turn on the living room" to turn on illumination devices in a living room area of the home. The user may similarly speak an activation word followed by a request to play a particular song, an album, or a playlist of music on a playback device in the home. Additional description regarding receiving and processing voice input data can be found in further detail below with respect to FIGS. 3A-3F.

d. Suitable Control Devices

FIG. 1H is a partially schematic diagram of the control device 130a (FIGS. 1A and 1B). As used herein, the term "control device" can be used interchangeably with "controller" or "control system." Among other features, the control device 130a is configured to receive user input related to the media playback system 100 and, in response, cause one or more devices in the media playback system 100 to perform an action(s) or operation(s) corresponding to the user input. In the illustrated embodiment, the control device 130a comprises a smartphone (e.g., an iPhone™, an Android phone) on which media playback system controller application software is installed. In some embodiments, the control device 130a comprises, for example, a tablet (e.g., an iPad™), a computer (e.g., a laptop computer, a desktop computer), and/or another suitable device (e.g., a television, an automobile audio head unit, an IoT device). In certain embodiments, the control device 130a comprises a dedicated controller for the media playback system 100. In other embodiments, as described above with respect to FIG. 1G, the control device 130a is integrated into another device in the media playback system 100 (e.g., one more of the playback devices 110, NMDs 120, and/or other suitable devices configured to communicate over a network).

The control device 130a includes electronics 132, a user interface 133, one or more speakers 134, and one or more microphones 135. The electronics 132 comprise one or more processors 132a (referred to hereinafter as "the processors 132a"), a memory 132b, software components 132c, and a network interface 132d. The processor 132a can be configured to perform functions relevant to facilitating user access, control, and configuration of the media playback system 100. The memory 132b can comprise data storage that can be loaded with one or more of the software components executable by the processor 302 to perform those functions. The software components 132c can comprise applications and/or other executable software configured to facilitate control of the media playback system 100. The memory 112b can be configured to store, for example, the software components 132c, media playback system controller application software, and/or other data associated with the media playback system 100 and the user.

The network interface 132d is configured to facilitate network communications between the control device 130a and one or more other devices in the media playback system 100, and/or one or more remote devices. In some embodiments, the network interface 132 is configured to operate according to one or more suitable communication industry standards (e.g., infrared, radio, wired standards including IEEE 802.3, wireless standards including IEEE 802.11a, 802.11b, 802.11g, 802.11n, 802.11ac, 802.15, 4G, LTE). The network interface 132d can be configured, for example, to transmit data to and/or receive data from the playback devices 110, the NMDs 120, other ones of the control devices 130, one of the computing devices 106 of FIG. 1B, devices comprising one or more other media playback systems, etc. The transmitted and/or received data can include, for example, playback device control commands, state variables, playback zone and/or zone group configurations. For instance, based on user input received at the user interface 133, the network interface 132d can transmit a playback device control command (e.g., volume control, audio playback control, audio content selection) from the control device 304 to one or more of the playback devices 100. The network interface 132d can also transmit and/or receive configuration changes such as, for example, adding/removing one or more playback devices 100 to/from a zone, adding/removing one or more zones to/from a zone group, forming a bonded or consolidated player, separating one or more playback devices from a bonded or consolidated player, among others. Additional description of zones and groups can be found below with respect to FIGS. 1-I through 1M.

The user interface 133 is configured to receive user input and can facilitate control of the media playback system 100. The user interface 133 includes media content art 133a (e.g., album art, lyrics, videos), a playback status indicator 133b (e.g., an elapsed and/or remaining time indicator), media content information region 133c, a playback control region 133d, and a zone indicator 133e. The media content information region 133c can include a display of relevant information (e.g., title, artist, album, genre, release year) about media content currently playing and/or media content in a queue or playlist. The playback control region 133d can include selectable (e.g., via touch input and/or via a cursor or another suitable selector) icons to cause one or more playback devices in a selected playback zone or zone group to perform playback actions such as, for example, play or pause, fast forward, rewind, skip to next, skip to previous, enter/exit shuffle mode, enter/exit repeat mode, enter/exit cross fade mode, etc. The playback control region 133d may also include selectable icons to modify equalization settings, playback volume, and/or other suitable playback actions. In the illustrated embodiment, the user interface 133 comprises a display presented on a touch screen interface of a smartphone (e.g., an iPhone™, an Android phone). In some embodiments, however, user interfaces of varying formats, styles, and interactive sequences may alternatively be implemented on one or more network devices to provide comparable control access to a media playback system.

The one or more speakers 134 (e.g., one or more transducers) can be configured to output sound to the user of the control device 130a. In some embodiments, the one or more speakers comprise individual transducers configured to correspondingly output low frequencies, mid-range frequencies, and/or high frequencies. In some aspects, for example, the control device 130a is configured as a playback device (e.g., one of the playback devices 110). Similarly, in some embodiments the control device 130a is configured as an NMD (e.g., one of the NMDs 120), receiving voice commands and other sounds via the one or more microphones 135.

The one or more microphones 135 can comprise, for example, one or more condenser microphones, electret condenser microphones, dynamic microphones, and/or other suitable types of microphones or transducers. In some embodiments, two or more of the microphones 135 are arranged to capture location information of an audio source (e.g., voice, audible sound) and/or configured to facilitate filtering of background noise. Moreover, in certain embodiments, the control device 130a is configured to operate as playback device and an NMD. In other embodiments, however, the control device 130a omits the one or more speakers 134 and/or the one or more microphones 135. For instance, the control device 130a may comprise a device (e.g., a thermostat, an IoT device, a network device) comprising a portion of the electronics 132 and the user interface 133 (e.g., a touch screen) without any speakers or microphones. Additional control device embodiments are described in further detail below with respect to FIGS. 4A-4D and 5.

e. Suitable Playback Device Configurations

Figures 1I, 1J:
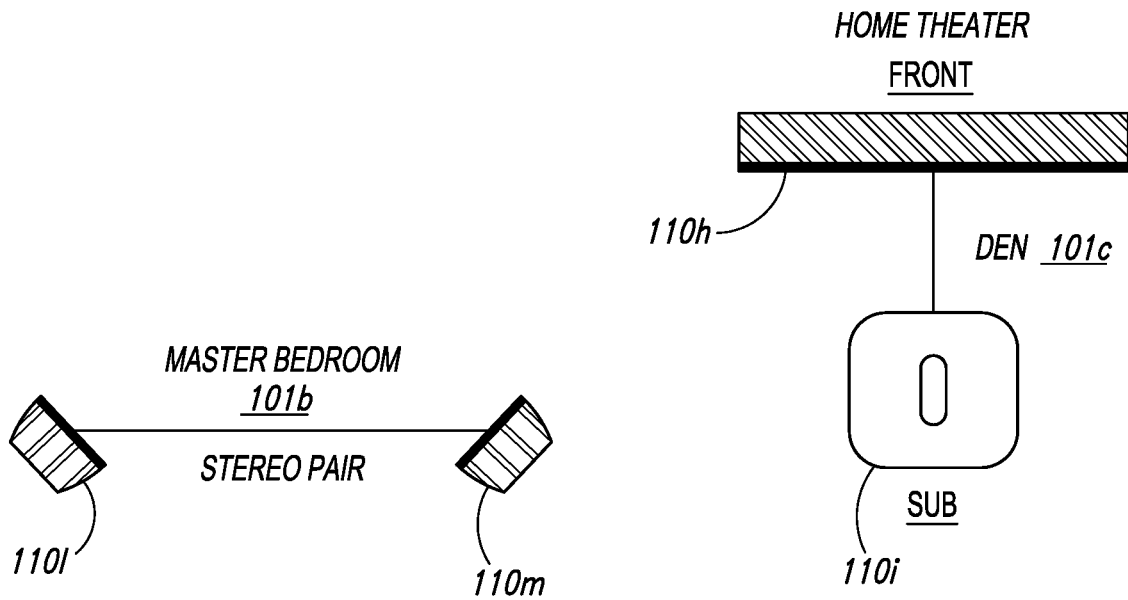
FIG. 1F is a block diagram of a network microphone device.
FIG. 1G is a block diagram of a playback device.
FIG. 1H is a partially schematic diagram of a control device.
FIGS. 1-I through 1L are schematic diagrams of corresponding media playback system zones.
FIG. 1M is a schematic diagram of media playback system areas.
Figures 1K, 1L:
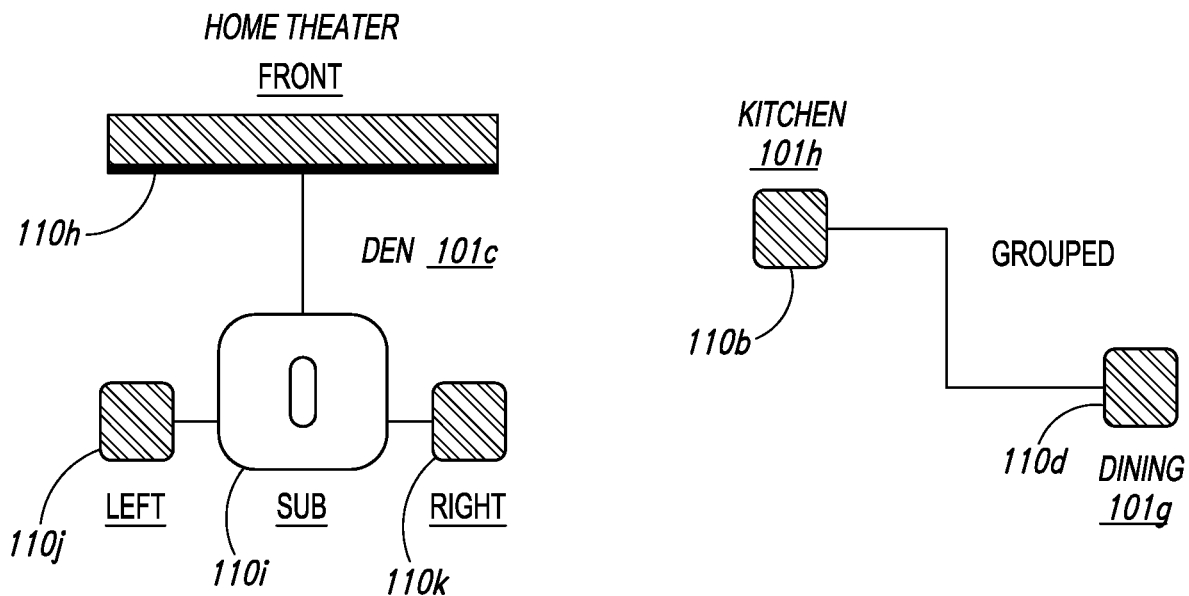
Figure 1M:
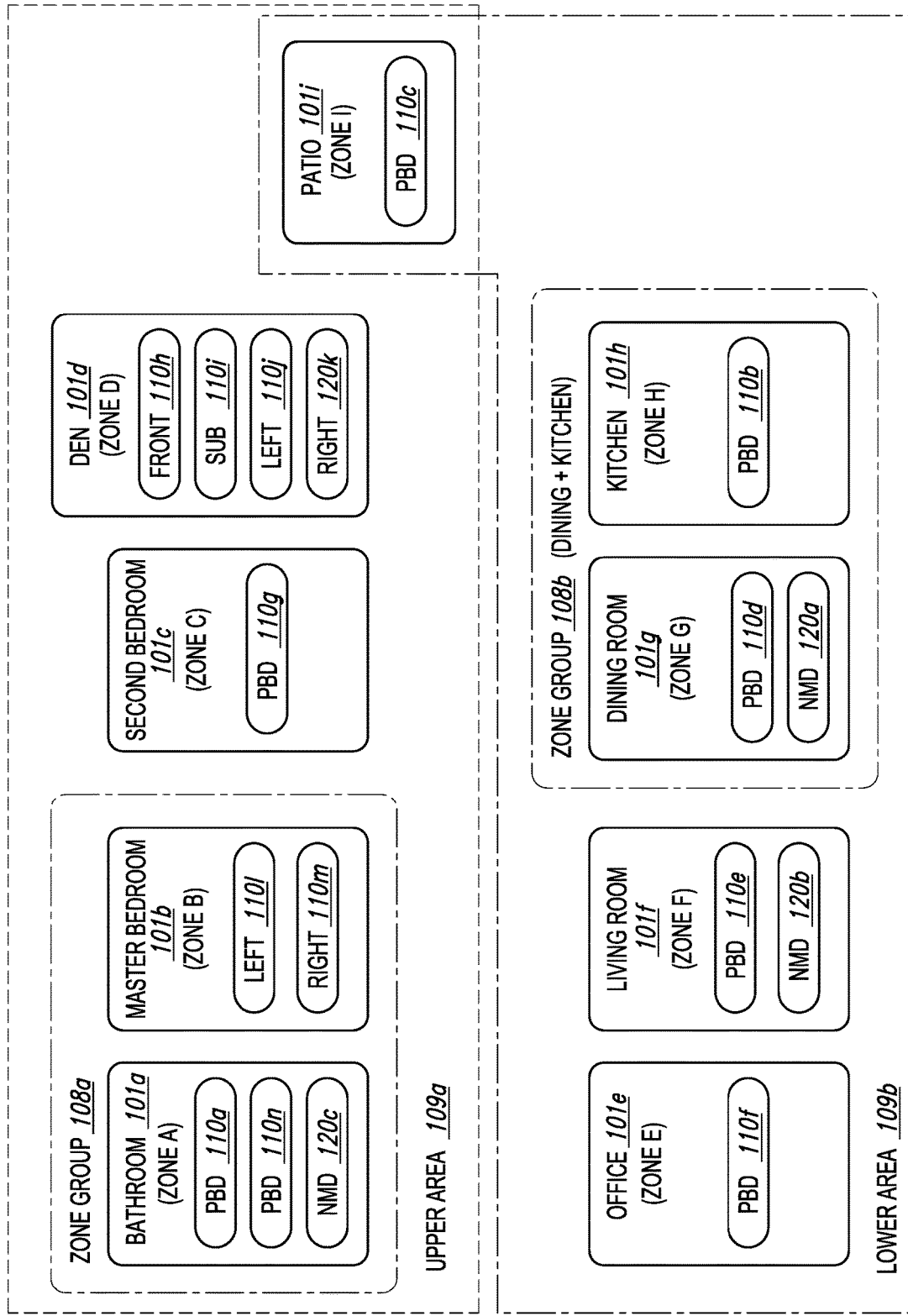

FIGS. 1-1 through 1M show example configurations of playback devices in zones and zone groups. Referring first to FIG. 1M, in one example, a single playback device may belong to a zone. For example, the playback device 110g in the second bedroom 101c (FIG. 1A) may belong to Zone C. In some implementations described below, multiple playback devices may be "bonded" to form a "bonded pair" which together form a single zone. For example, the playback device 110l (e.g., a left playback device) can be bonded to the playback device 110l (e.g., a left playback device) to form Zone A. Bonded playback devices may have different playback responsibilities (e.g., channel responsibilities). In another implementation described below, multiple playback devices may be merged to form a single zone. For example, the playback device 110*h* (e.g., a front playback device) may be merged with the playback device 110*i* (e.g., a subwoofer), and the playback devices 110*j* and 110*k* (e.g., left and right surround speakers, respectively) to form a single Zone D. In another example, the playback devices 110*g* and 110*h* can be merged to form a merged group or a zone group 108*b*. The merged playback devices 110*g* and 110*h* may not be specifically assigned different playback responsibilities. That is, the merged playback devices 110*h* and 110*i* may, aside from playing audio content in synchrony, each play audio content as they would if they were not merged.

Each zone in the media playback system 100 may be provided for control as a single user interface (UI) entity. For example, Zone A may be provided as a single entity named Master Bathroom. Zone B may be provided as a single entity named Master Bedroom. Zone C may be provided as a single entity named Second Bedroom.

Playback devices that are bonded may have different playback responsibilities, such as responsibilities for certain audio channels. For example, as shown in FIG. 1-I, the playback devices 110*l* and 110*m* may be bonded so as to produce or enhance a stereo effect of audio content. In this example, the playback device 110*l* may be configured to play a left channel audio component, while the playback device 110*k* may be configured to play a right channel audio component. In some implementations, such stereo bonding may be referred to as "pairing."

Additionally, bonded playback devices may have additional and/or different respective speaker drivers. As shown in FIG. 1J, the playback device 110*h* named Front may be bonded with the playback device 110*i* named SUB. The Front device 110*h* can be configured to render a range of mid to high frequencies and the SUB device 110*i* can be configured render low frequencies. When unbonded, however, the Front device 110*h* can be configured render a full range of frequencies. As another example, FIG. 1K shows the Front and SUB devices 110*h* and 110*i* further bonded with Left and Right playback devices 110*j* and 110*k*, respectively. In some implementations, the Right and Left devices 110*j* and 110*k* can be configured to form surround or "satellite" channels of a home theater system. The bonded playback devices 110*h*, 110*i*, 110*j*, and 110*k* may form a single Zone D (FIG. 1M).

Playback devices that are merged may not have assigned playback responsibilities, and may each render the full range of audio content the respective playback device is capable of. Nevertheless, merged devices may be represented as a single UI entity (i.e., a zone, as discussed above). For instance, the playback devices 110*a* and 110*n* the master bathroom have the single UI entity of Zone A. In one embodiment, the playback devices 110*a* and 110*n* may each output the full range of audio content each respective playback devices 110*a* and 110*n* are capable of, in synchrony.

In some embodiments, an NMD is bonded or merged with another device so as to form a zone. For example, the NMD 120*b* may be bonded with the playback device 110*e*, which together form Zone F, named Living Room. In other embodiments, a stand-alone network microphone device may be in a zone by itself. In other embodiments, however, a stand-alone network microphone device may not be associated with a zone. Additional details regarding associating network microphone devices and playback devices as designated or default devices may be found, for example, in previously referenced U.S. patent application Ser. No. 15/438,749.

Zones of individual, bonded, and/or merged devices may be grouped to form a zone group. For example, referring to FIG. 1M, Zone A may be grouped with Zone B to form a zone group 108*a* that includes the two zones. Similarly, Zone G may be grouped with Zone H to form the zone group 108*b*. As another example, Zone A may be grouped with one or more other Zones C-I. The Zones A-I may be grouped and ungrouped in numerous ways. For example, three, four, five, or more (e.g., all) of the Zones A-I may be grouped. When grouped, the zones of individual and/or bonded playback devices may play back audio in synchrony with one another, as described in previously referenced U.S. Pat. No. 8,234,395. Playback devices may be dynamically grouped and ungrouped to form new or different groups that synchronously play back audio content.

In various implementations, the zones in an environment may be the default name of a zone within the group or a combination of the names of the zones within a zone group. For example, Zone Group 108*b* can have be assigned a name such as "Dining+Kitchen", as shown in FIG. 1M. In some embodiments, a zone group may be given a unique name selected by a user.

Certain data may be stored in a memory of a playback device (e.g., the memory 112*c* of FIG. 1C) as one or more state variables that are periodically updated and used to describe the state of a playback zone, the playback device(s), and/or a zone group associated therewith. The memory may also include the data associated with the state of the other devices of the media system, and shared from time to time among the devices so that one or more of the devices have the most recent data associated with the system.

In some embodiments, the memory may store instances of various variable types associated with the states. Variables instances may be stored with identifiers (e.g., tags) corresponding to type. For example, certain identifiers may be a first type "a1" to identify playback device(s) of a zone, a second type "b1" to identify playback device(s) that may be bonded in the zone, and a third type "c1" to identify a zone group to which the zone may belong. As a related example, identifiers associated with the second bedroom 101*c* may indicate that the playback device is the only playback device of the Zone C and not in a zone group. Identifiers associated with the Den may indicate that the Den is not grouped with other zones but includes bonded playback devices 110*h*-110*k*. Identifiers associated with the Dining Room may indicate that the Dining Room is part of the Dining+Kitchen zone group 108*b* and that devices 110*b* and 110*d* are grouped (FIG. 1L). Identifiers associated with the Kitchen may indicate the same or similar information by virtue of the Kitchen being part of the Dining+Kitchen zone group 108*b*. Other example zone variables and identifiers are described below.

In yet another example, the media playback system 100 may variables or identifiers representing other associations of zones and zone groups, such as identifiers associated with Areas, as shown in FIG. 1M. An area may involve a cluster of zone groups and/or zones not within a zone group. For instance, FIG. 1M shows an Upper Area 109*a* including Zones A-D, and a Lower Area 109*b* including Zones E-I. In one aspect, an Area may be used to invoke a cluster of zone groups and/or zones that share one or more zones and/or zone groups of another cluster. In another aspect, this differs from a zone group, which does not share a zone with another zone group. Further examples of techniques for implementing Areas may be found, for example, in U.S. application Ser. No. 15/682,506 filed Aug. 21, 2017 and titled "Room Association Based on Name," and U.S. Pat. No. 8,483,853 filed Sep. 11, 2007, and titled "Controlling and manipulating groupings in a multi-zone media system." Each of these applications is incorporated herein by reference in its entirety. In some embodiments, the media playback system 100 may not implement Areas, in which case the system may not store variables associated with Areas.

III. Example Systems and Devices

Figure 2A:
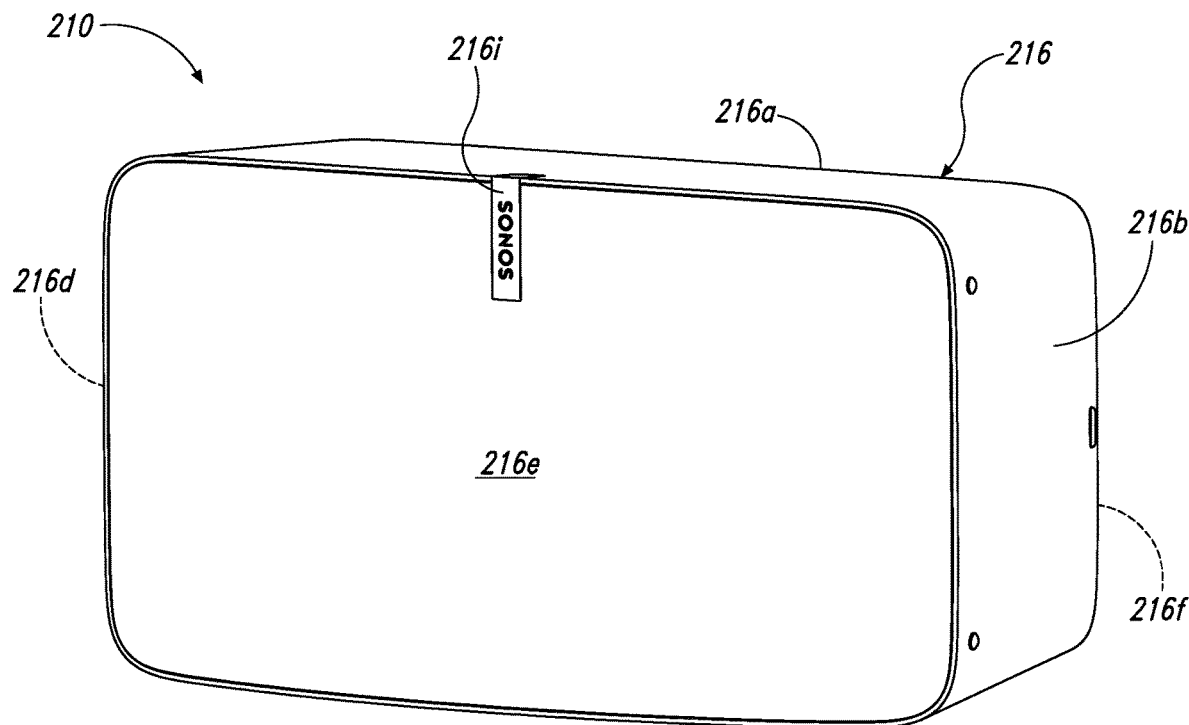
FIG. 2A is a front isometric view of a playback device configured in accordance with aspects of the disclosed technology.
Figure 2B:
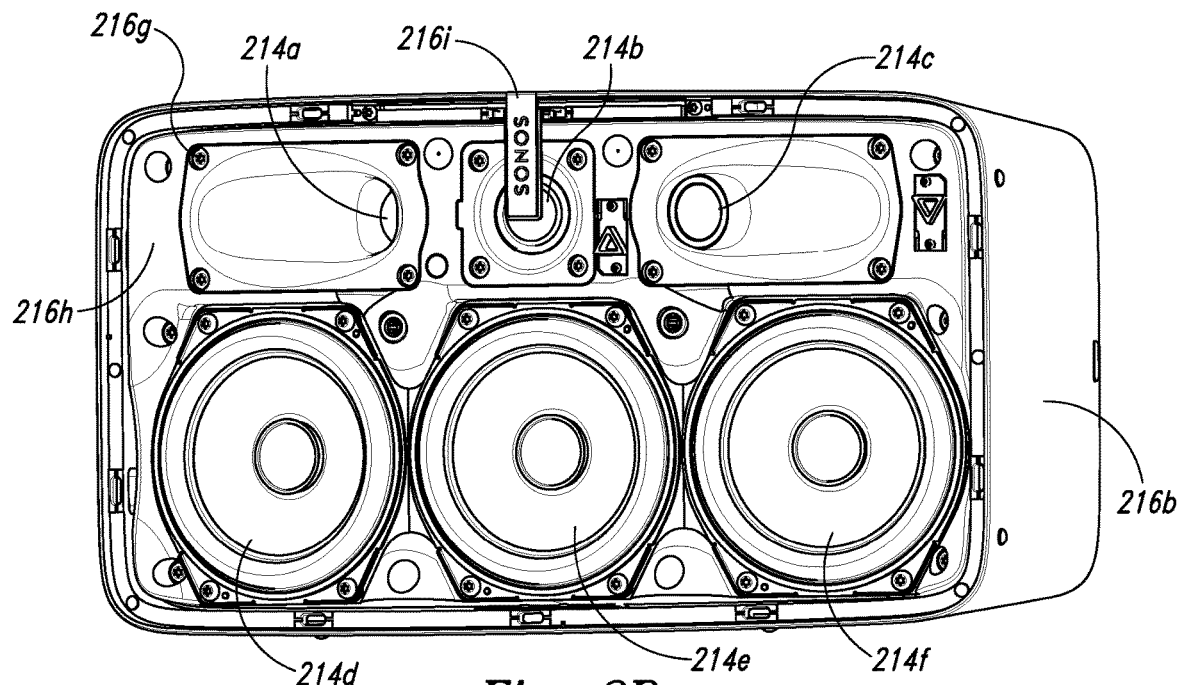
FIG. 2B is a front isometric view of the playback device of FIG. 3A without a grille.
Figure 2C:
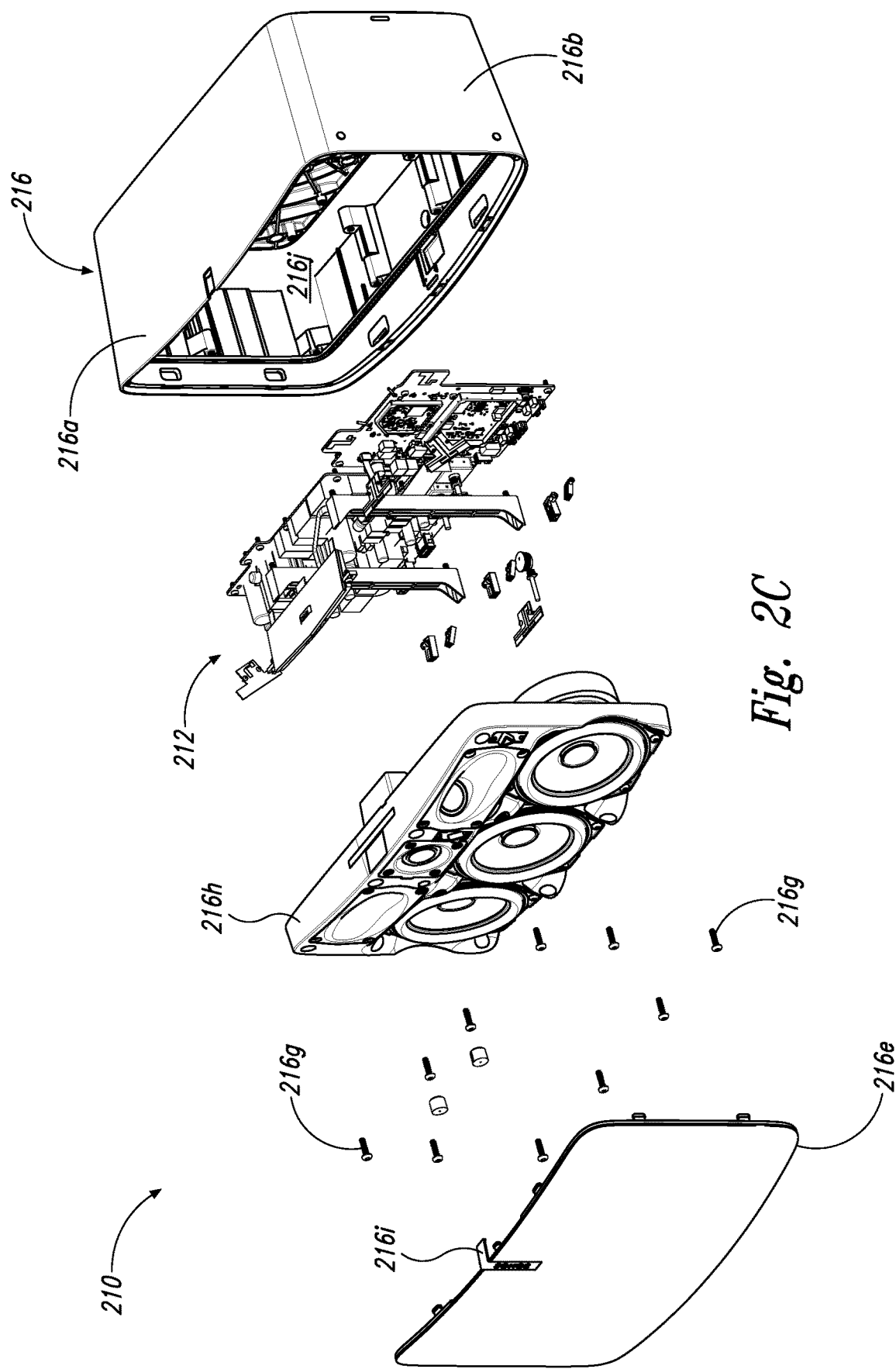
FIG. 2C is an exploded view of the playback device of FIG. 2A.

FIG. 2A is a front isometric view of a playback device 210 configured in accordance with aspects of the disclosed technology. FIG. 2B is a front isometric view of the playback device 210 without a grille 216e. FIG. 2C is an exploded view of the playback device 210. Referring to FIGS. 2A-2C together, the playback device 210 comprises a housing 216 that includes an upper portion 216a, a right or first side portion 216b, a lower portion 216c, a left or second side portion 216d, the grille 216e, and a rear portion 216f. A plurality of fasteners 216g (e.g., one or more screws, rivets, clips) attaches a frame 216h to the housing 216. A cavity 216j (FIG. 2C) in the housing 216 is configured to receive the frame 216h and electronics 212. The frame 216h is configured to carry a plurality of transducers 214 (identified individually in FIG. 2B as transducers 214a-f). The electronics 212 (e.g., the electronics 112 of FIG. 1C) is configured to receive audio content from an audio source and send electrical signals corresponding to the audio content to the transducers 214 for playback.

The transducers 214 are configured to receive the electrical signals from the electronics 112, and further configured to convert the received electrical signals into audible sound during playback. For instance, the transducers 214a-c (e.g., tweeters) can be configured to output high frequency sound (e.g., sound waves having a frequency greater than about 2 kHz). The transducers 214d-f (e.g., mid-woofers, woofers, midrange speakers) can be configured output sound at frequencies lower than the transducers 214a-c (e.g., sound waves having a frequency lower than about 2 kHz). In some embodiments, the playback device 210 includes a number of transducers different than those illustrated in FIGS. 2A-2C. For example, as described in further detail below with respect to FIGS. 3A-3C, the playback device 210 can include fewer than six transducers (e.g., one, two, three). In other embodiments, however, the playback device 210 includes more than six transducers (e.g., nine, ten). Moreover, in some embodiments, all or a portion of the transducers 214 are configured to operate as a phased array to desirably adjust (e.g., narrow or widen) a radiation pattern of the transducers 214, thereby altering a user's perception of the sound emitted from the playback device 210.

In the illustrated embodiment of FIGS. 2A-2C, a filter 216i is axially aligned with the transducer 214b. The filter 216i can be configured to desirably attenuate a predetermined range of frequencies that the transducer 214b outputs to improve sound quality and a perceived sound stage output collectively by the transducers 214. In some embodiments, however, the playback device 210 omits the filter 216i. In other embodiments, the playback device 210 includes one or more additional filters aligned with the transducers 214b and/or at least another of the transducers 214.

Figure 3A:
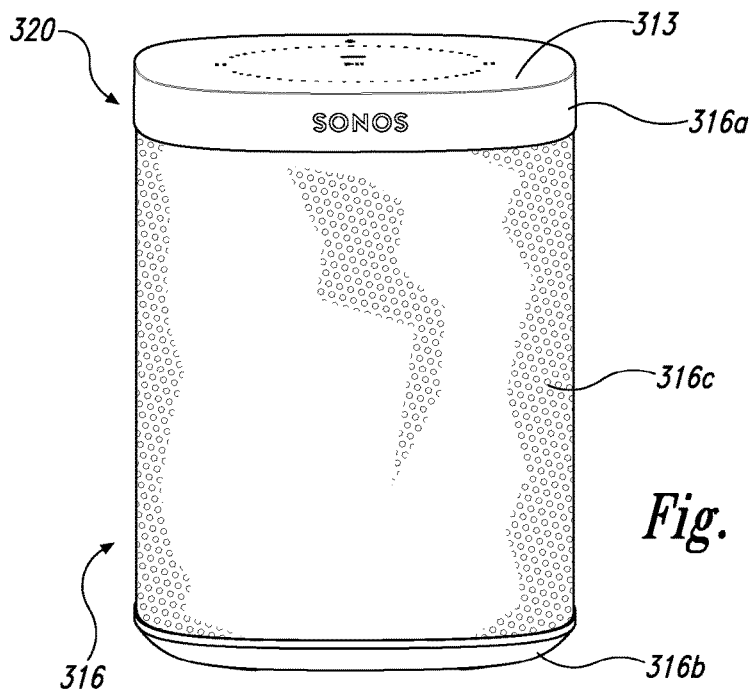
FIG. 3A is a front view of a network microphone device configured in accordance with aspects of the disclosed technology.
Figure 3B:
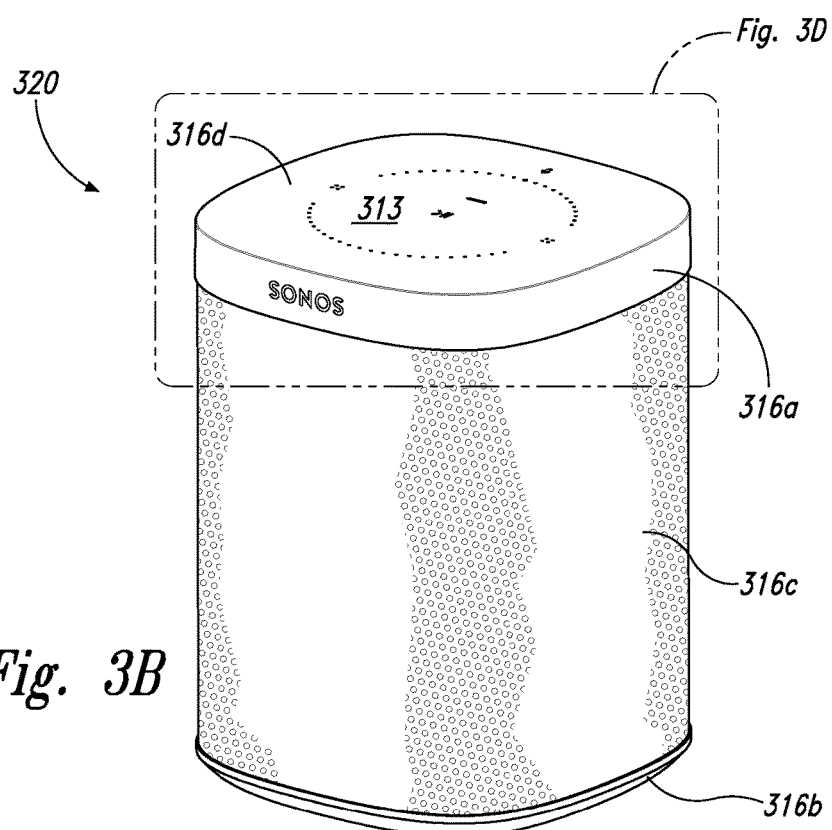
FIG. 3B is a side isometric view of the network microphone device of FIG. 3A.
Figure 3C:
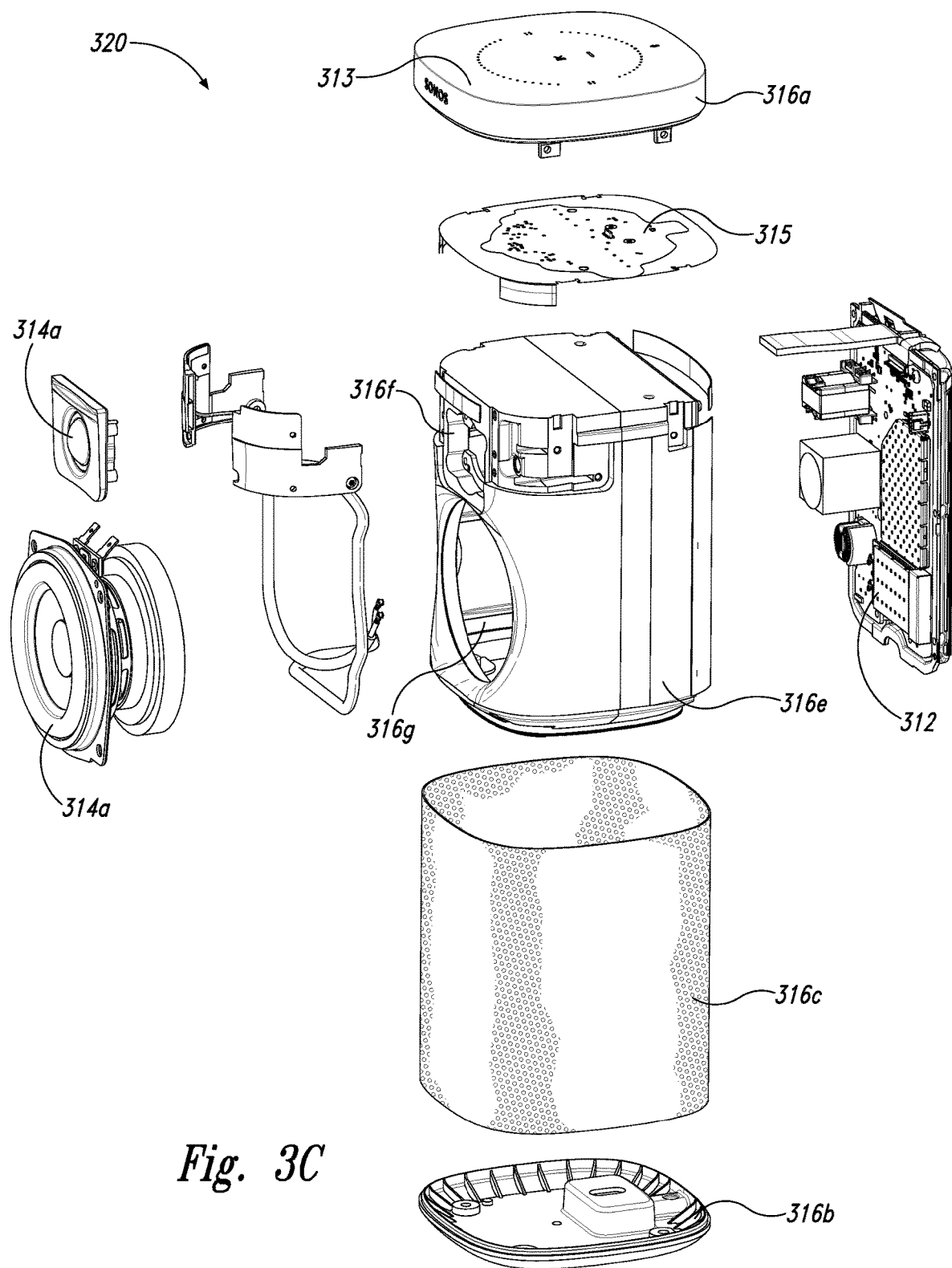
FIG. 3C is an exploded view of the network microphone device of FIGS. 3A and 3B.
Figure 3D:
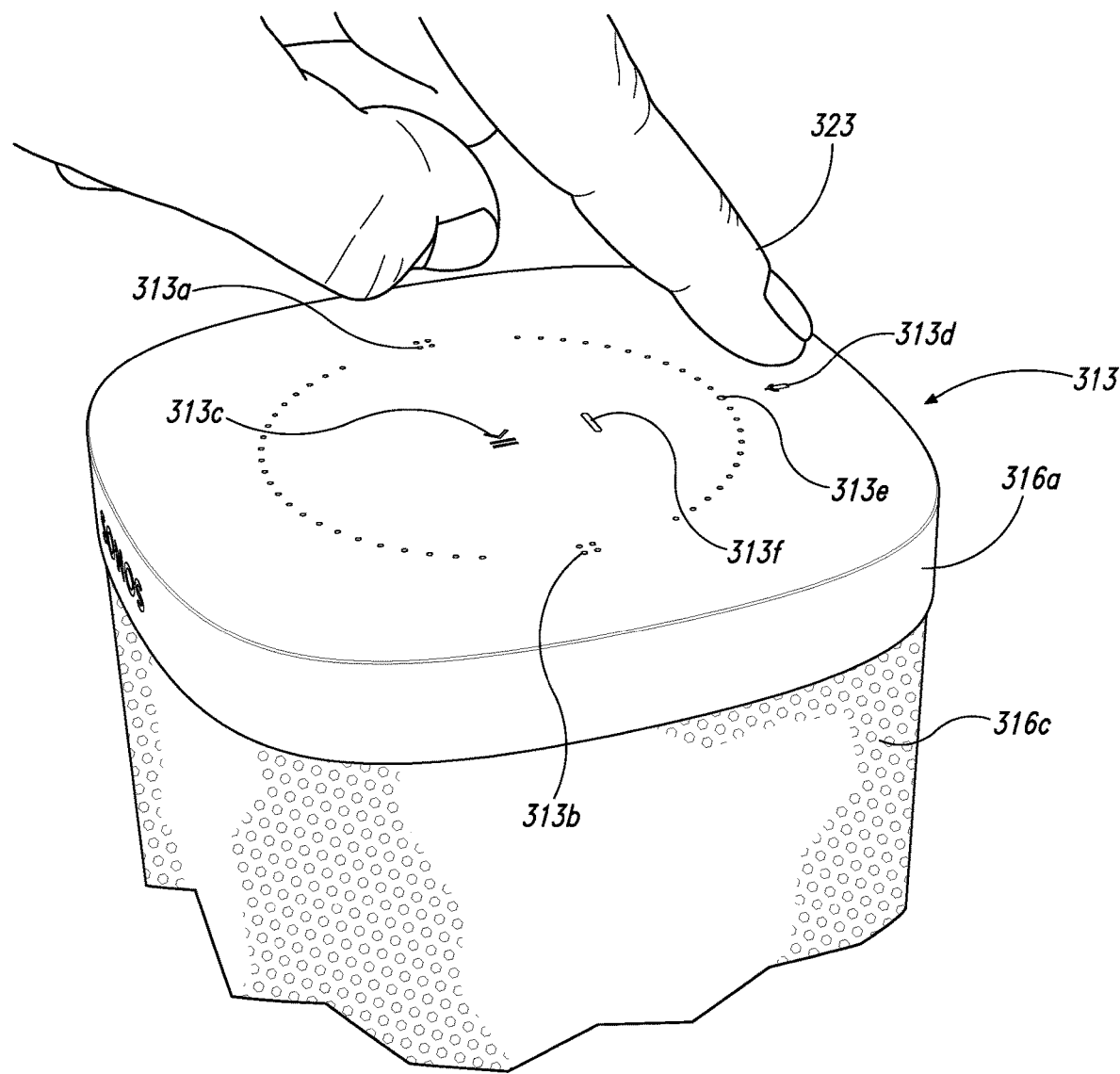
FIG. 3D is an enlarged view of a portion of FIG. 3B.

FIGS. 3A and 3B are front and right isometric side views, respectively, of an NMD 320 configured in accordance with embodiments of the disclosed technology. FIG. 3C is an exploded view of the NMD 320. FIG. 3D is an enlarged view of a portion of FIG. 3B including a user interface 313 of the NMD 320. Referring first to FIGS. 3A-3C, the NMD 320 includes a housing 316 comprising an upper portion 316a, a lower portion 316b and an intermediate portion 316c (e.g., a grille). A plurality of ports, holes or apertures 316d in the upper portion 316a allow sound to pass through to one or more microphones 315 (FIG. 3C) positioned within the housing 316. The one or more microphones 316 are configured to received sound via the apertures 316d and produce electrical signals based on the received sound. In the illustrated embodiment, a frame 316e (FIG. 3C) of the housing 316 surrounds cavities 316f and 316g configured to house, respectively, a first transducer 314a (e.g., a tweeter) and a second transducer 314b (e.g., a mid-woofer, a midrange speaker, a woofer). In other embodiments, however, the NMD 320 includes a single transducer, or more than two (e.g., two, five, six) transducers. In certain embodiments, the NMD 320 omits the transducers 314a and 314b altogether.

Electronics 312 (FIG. 3C) includes components configured to drive the transducers 314a and 314b, and further configured to analyze audio data corresponding to the electrical signals produced by the one or more microphones 315. In some embodiments, for example, the electronics 312 comprises many or all of the components of the electronics 112 described above with respect to FIG. 1C. In certain embodiments, the electronics 312 includes components described above with respect to FIG. 1F such as, for example, the one or more processors 112a, the memory 112b, the software components 112c, the network interface 112d, etc. In some embodiments, the electronics 312 includes additional suitable components (e.g., proximity or other sensors).

Referring to FIG. 3D, the user interface 313 includes a plurality of control surfaces (e.g., buttons, knobs, capacitive surfaces) including a first control surface 313a (e.g., a previous control), a second control surface 313b (e.g., a next control), and a third control surface 313c (e.g., a play and/or pause control). A fourth control surface 313d is configured to receive touch input corresponding to activation and deactivation of the one or microphones 315. A first indicator 313e (e.g., one or more light emitting diodes (LEDs) or another suitable illuminator) can be configured to illuminate only when the one or more microphones 315 are activated. A second indicator 313f (e.g., one or more LEDs) can be configured to remain solid during normal operation and to blink or otherwise change from solid to indicate a detection of voice activity. In some embodiments, the user interface 313 includes additional or fewer control surfaces and illuminators. In one embodiment, for example, the user interface 313 includes the first indicator 313e, omitting the second indicator 313f. Moreover, in certain embodiments, the NMD 320 comprises a playback device and a control device, and the user interface 313 comprises the user interface of the control device.

Referring to FIGS. 3A-3D together, the NMD 320 is configured to receive voice commands from one or more adjacent users via the one or more microphones 315. As described above with respect to FIG. 1B, the one or more microphones 315 can acquire, capture, or record sound in a vicinity (e.g., a region within 10 m or less of the NMD 320) and transmit electrical signals corresponding to the recorded sound to the electronics 312. The electronics 312 can process the electrical signals and can analyze the resulting audio data to determine a presence of one or more voice commands (e.g., one or more activation words). In some embodiments, for example, after detection of one or more suitable voice commands, the NMD 320 is configured to transmit a portion of the recorded audio data to another device and/or a remote server (e.g., one or more of the computing devices 106 of FIG. 1B) for further analysis. The remote server can analyze the audio data, determine an appropriate action based on the voice command, and transmit a message to the NMD 320 to perform the appropriate action. For instance, a user may speak "Sonos, play Michael Jackson." The NMD 320 can, via the one or more microphones 315, record the user's voice utterance, determine the presence of a voice command, and transmit the audio data having the voice command to a remote server (e.g., one or more of the remote computing devices 106 of FIG. 1B, one or more servers of a VAS and/or another suitable service). The remote server can analyze the audio data and determine an action corresponding to the command. The remote server can then transmit a command to the NMD 320 to perform the determined action (e.g., play back audio content related to Michael Jackson). The NMD 320 can receive the command and play back the audio content related to Michael Jackson from a media content source. As described above with respect to FIG. 1B, suitable content sources can include a device or storage communicatively coupled to the NMD 320 via a LAN (e.g., the network 104 of FIG. 1B), a remote server (e.g., one or more of the remote computing devices 106 of FIG. 1B), etc. In certain embodiments, however, the NMD 320 determines and/or performs one or more actions corresponding to the one or more voice commands without intervention or involvement of an external device, computer, or server.

Figure 3E:
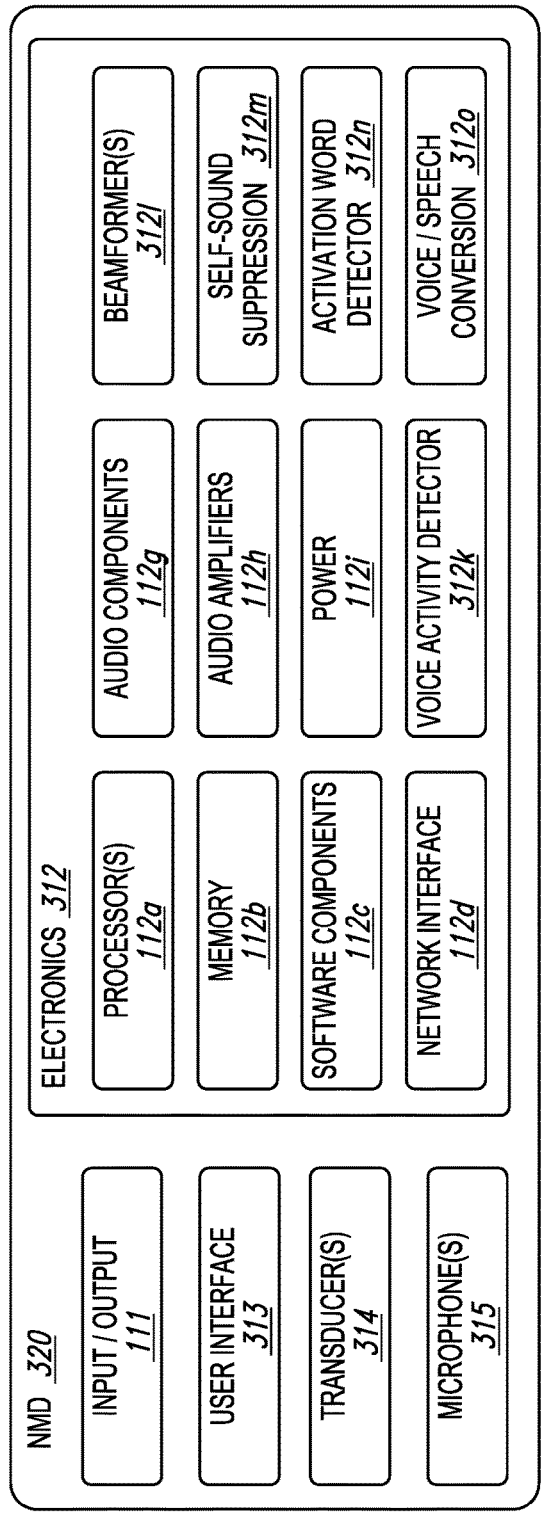
FIG. 3E is a block diagram of the network microphone device of FIGS. 3A-3D

FIG. 3E is a functional block diagram showing additional features of the NMD 320 in accordance with aspects of the disclosure. The NMD 320 includes components configured to facilitate voice command capture including voice activity detector component(s) 312k, beam former components 312l, acoustic echo cancellation (AEC) and/or self-sound suppression components 312m, activation word detector components 312n, and voice/speech conversion components 312o (e.g., voice-to-text and text-to-voice). In the illustrated embodiment of FIG. 3E, the foregoing components 312k-312o are shown as separate components. In some embodiments, however, one or more of the components 312k-312o are subcomponents of the processors 112a.

The beamforming and self-sound suppression components 312l and 312m are configured to detect an audio signal and determine aspects of voice input represented in the detected audio signal, such as the direction, amplitude, frequency spectrum, etc. The voice activity detector activity components 312k are operably coupled with the beamforming and AEC components 312l and 312m and are configured to determine a direction and/or directions from which voice activity is likely to have occurred in the detected audio signal. Potential speech directions can be identified by monitoring metrics which distinguish speech from other sounds. Such metrics can include, for example, energy within the speech band relative to background noise and entropy within the speech band, which is measure of spectral structure. As those of ordinary skill in the art will appreciate, speech typically has a lower entropy than most common background noise. The activation word detector components 312n are configured to monitor and analyze received audio to determine if any activation words (e.g., wake words) are present in the received audio. The activation word detector components 312n may analyze the received audio using an activation word detection algorithm. If the activation word detector 312n detects an activation word, the NMD 320 may process voice input contained in the received audio. Example activation word detection algorithms accept audio as input and provide an indication of whether an activation word is present in the audio. Many first- and third-party activation word detection algorithms are known and commercially available. For instance, operators of a voice service may make their algorithm available for use in third-party devices. Alternatively, an algorithm may be trained to detect certain activation words. In some embodiments, the activation word detector 312n runs multiple activation word detection algorithms on the received audio simultaneously (or substantially simultaneously). As noted above, different voice services (e.g. AMAZON's ALEXA®, APPLE's SIRI®, or MICROSOFT's CORTANA®) can each use a different activation word for invoking their respective voice service. To support multiple services, the activation word detector 312n may run the received audio through the activation word detection algorithm for each supported voice service in parallel.

The speech/text conversion components 312o may facilitate processing by converting speech in the voice input to text. In some embodiments, the electronics 312 can include voice recognition software that is trained to a particular user or a particular set of users associated with a household. Such voice recognition software may implement voice-processing algorithms that are tuned to specific voice profile(s). Tuning to specific voice profiles may require less computationally intensive algorithms than traditional voice activity services, which typically sample from a broad base of users and diverse requests that are not targeted to media playback systems.

Figure 3F:
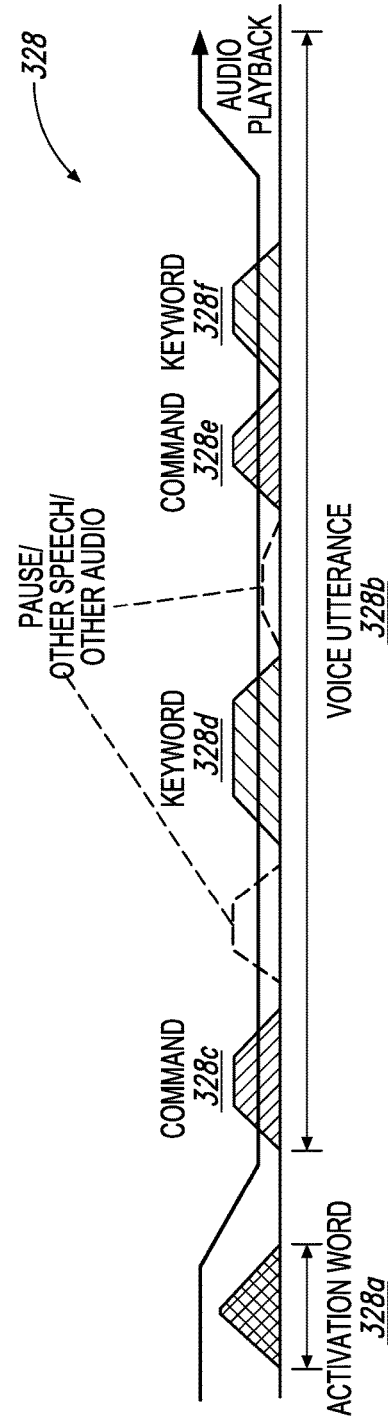
FIG. 3F is a schematic diagram of an example voice input.

FIG. 3F is a schematic diagram of an example voice input 328 captured by the NMD 320 in accordance with aspects of the disclosure. The voice input 328 can include a activation word portion 328a and a voice utterance portion 328b. In some embodiments, the activation word 557a can be a known activation word, such as "Alexa," which is associated with AMAZON's ALEXA®. In other embodiments, however, the voice input 328 may not include a activation word. In some embodiments, a network microphone device may output an audible and/or visible response upon detection of the activation word portion 328a. In addition or alternately, an NMB may output an audible and/or visible response after processing a voice input and/or a series of voice inputs.

The voice utterance portion 328b may include, for example, one or more spoken commands (identified individually as a first command 328c and a second command 328e) and one or more spoken keywords (identified individually as a first keyword 328d and a second keyword 328f). In one example, the first command 328c can be a command to play music, such as a specific song, album, playlist, etc. In this example, the keywords may be one or words identifying one or more zones in which the music is to be played, such as the Living Room and the Dining Room shown in FIG. 1A. In some examples, the voice utterance portion 328b can include other information, such as detected pauses (e.g., periods of non-speech) between words spoken by a user, as shown in FIG. 3F. The pauses may demarcate the locations of separate commands, keywords, or other information spoke by the user within the voice utterance portion 328b.

In some embodiments, the media playback system 100 is configured to temporarily reduce the volume of audio content that it is playing while detecting the activation word portion 557a. The media playback system 100 may restore the volume after processing the voice input 328, as shown in FIG. 3F. Such a process can be referred to as ducking, examples of which are disclosed in U.S. patent application Ser. No. 15/438,749, incorporated by reference herein in its entirety.

Figure 4A:
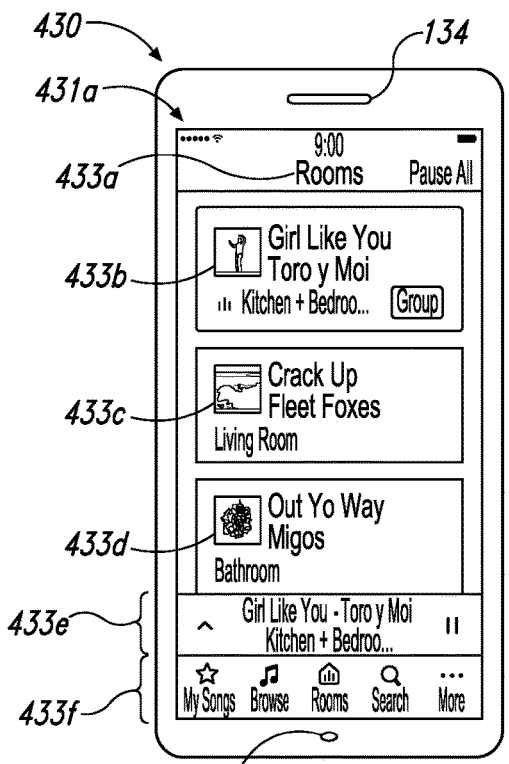
FIGS. 4A-4D are schematic diagrams of a control device in various stages of operation in accordance with aspects of the disclosed technology.
Figure 4B:
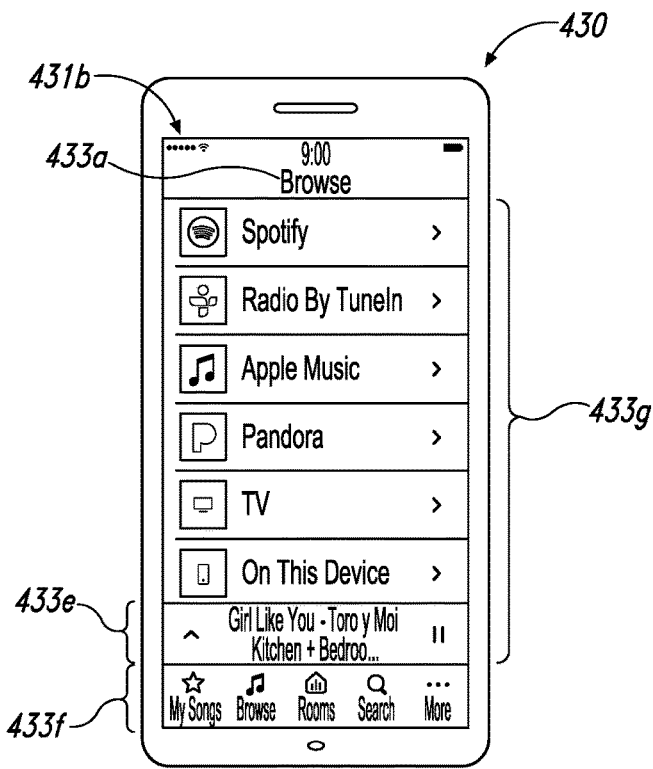
Figure 4C:
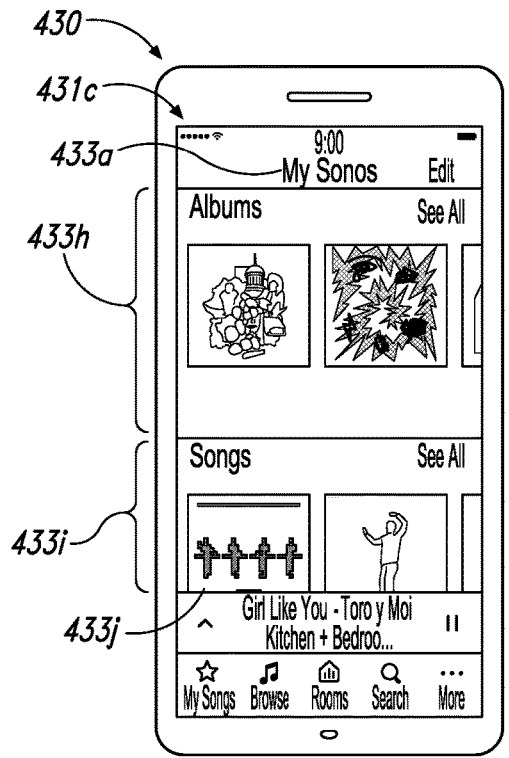
Figure 4D:
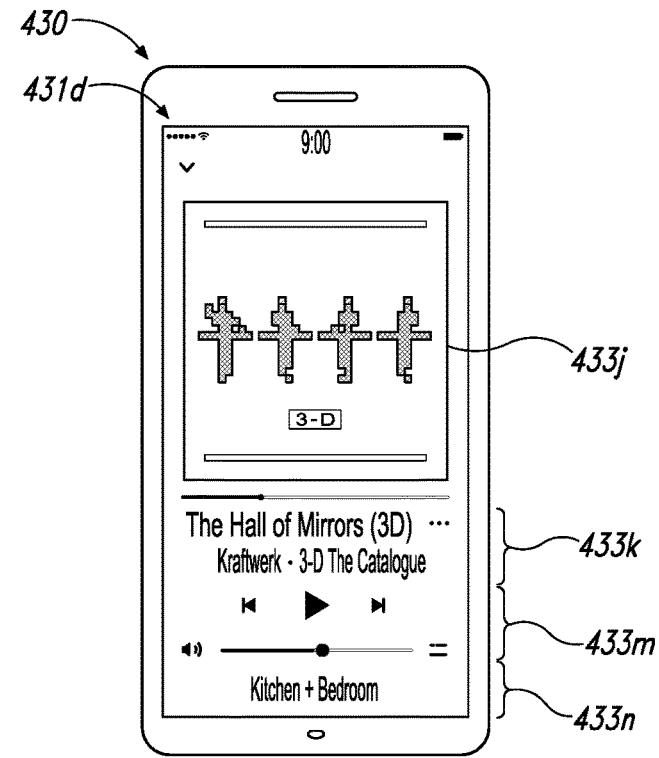

FIGS. 4A-4D are schematic diagrams of a control device 430 (e.g., the control device 130a of FIG. 1H, a smartphone, a tablet, a dedicated control device, an IoT device, and/or another suitable device) showing corresponding user interface displays in various states of operation. A first user interface display 431a (FIG. 4A) includes a display name 433a (i.e., "Rooms"). A selected group region 433b displays audio content information (e.g., artist name, track name, album art) of audio content played back in the selected group and/or zone. Group regions 433c and 433d display corresponding group and/or zone name, and audio content information audio content played back or next in a playback queue of the respective group or zone. An audio content region 433e includes information related to audio content in the selected group and/or zone (i.e., the group and/or zone indicated in the selected group region 433b). A lower display region 433f is configured to receive touch input to display one or more other user interface displays. For example, if a user selects "Browse" in the lower display region 433f, the control device 430 can be configured to output a second user interface display 431b (FIG. 4B) comprising a plurality of music services 433g (e.g., Spotify, Radio by Tunein, Apple Music, Pandora, Amazon, TV, local music, line-in) through which the user can browse and from which the user can select media content for play back via one or more playback devices (e.g., one of the playback devices 110 of FIG. 1A). Alternatively, if the user selects "My Sonos" in the lower display region 433f, the control device 430 can be configured to output a third user interface display 431c (FIG. 4C). A first media content region 433h can include graphical representations (e.g., album art) corresponding to individual albums, stations, or playlists. A second media content region 433i can include graphical representations (e.g., album art) corresponding to individual songs, tracks, or other media content. If the user selections a graphical representation 433j (FIG. 4C), the control device 430 can be configured to begin play back of audio content corresponding to the graphical representation 433j and output a fourth user interface display 431d fourth user interface display 431d includes an enlarged version of the graphical representation 433j, media content information 433k (e.g., track name, artist, album), transport controls 433m (e.g., play, previous, next, pause, volume), and indication 433n of the currently selected group and/or zone name.

Figure 5:
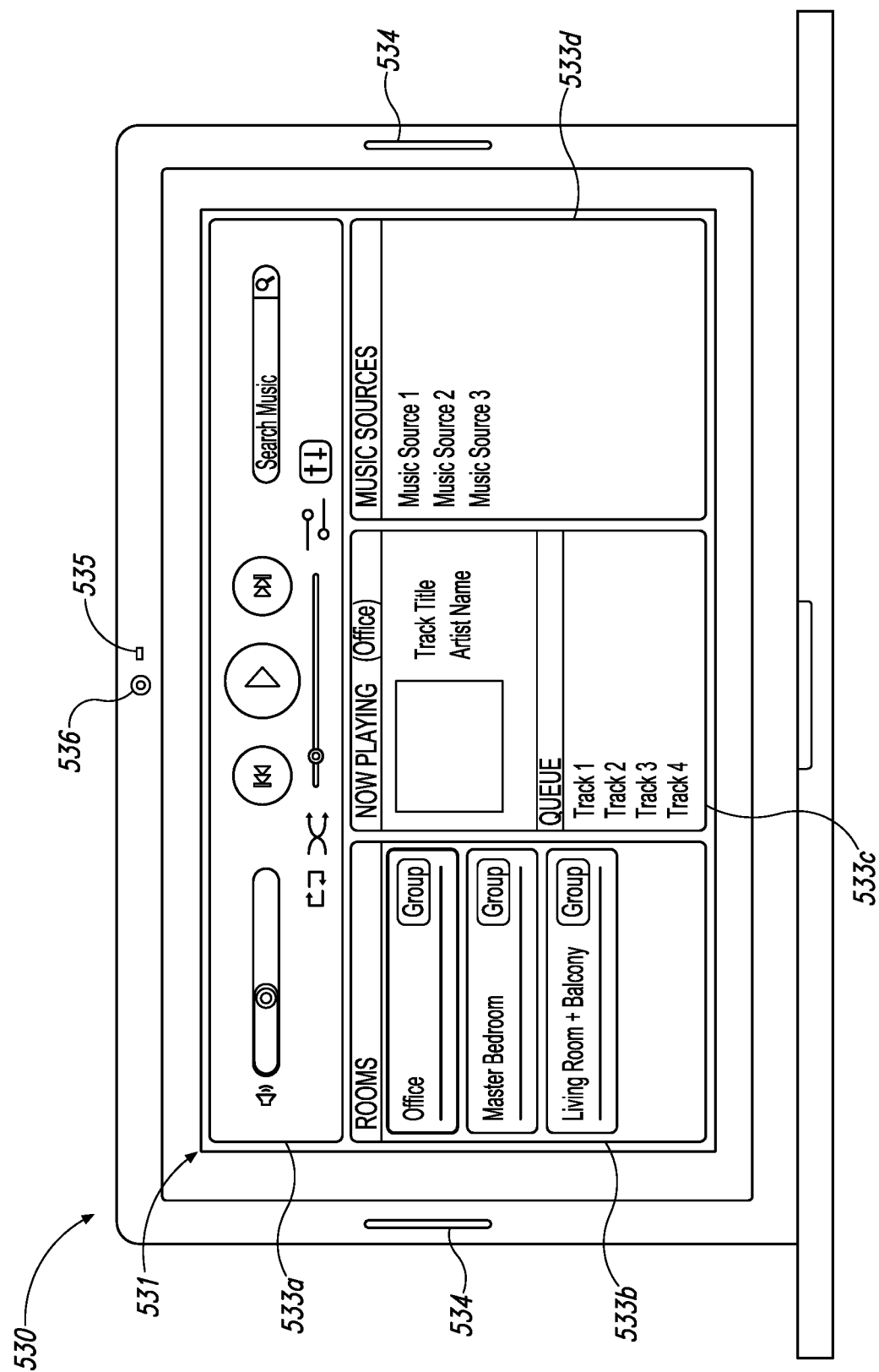
FIG. 5 is front view of a control device.

FIG. 5 is a schematic diagram of a control device 530 (e.g., a laptop computer, a desktop computer). The control device 530 includes transducers 534, a microphone 535, and a camera 536. A user interface 531 includes a transport control region 533a, a playback status region 533b, a playback zone region 533c, a playback queue region 533d, and a media content source region 533e. The transport control region comprises one or more controls for controlling media playback including, for example, volume, previous, play/pause, next, repeat, shuffle, track position, crossfade, equalization, etc. The audio content source region 533e includes a listing of one or more media content sources from which a user can select media items for play back and/or adding to a playback queue.

The playback zone region 533b can include representations of playback zones within the media playback system 100 (FIGS. 1A and 1B). In some embodiments, the graphical representations of playback zones may be selectable to bring up additional selectable icons to manage or configure the playback zones in the media playback system, such as a creation of bonded zones, creation of zone groups, separation of zone groups, renaming of zone groups, etc. In the illustrated embodiment, a "group" icon is provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone can be configured to play audio content in synchrony with the playback device(s) in the particular zone. Analogously, a "group" icon may be provided within a graphical representation of a zone group. In the illustrated embodiment, the "group" icon may be selectable to bring up options to deselect one or more zones in the zone group to be removed from the zone group. In some embodiments, the control device 530 includes other interactions and implementations for grouping and ungrouping zones via the user interface 531. In certain embodiments, the representations of playback zones in the playback zone region 533b can be dynamically updated as playback zone or zone group configurations are modified.

The playback status region 533c includes graphical representations of audio content that is presently being played, previously played, or scheduled to play next in the selected playback zone or zone group. The selected playback zone or zone group may be visually distinguished on the user interface, such as within the playback zone region 533b and/or the playback queue region 533d. The graphical representations may include track title, artist name, album name, album year, track length, and other relevant information that may be useful for the user to know when controlling the media playback system 100 via the user interface 531.

The playback queue region 533d includes graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device. In some embodiments, for example, a playlist can be added to a playback queue, in which information corresponding to each audio item in the playlist may be added to the playback queue. In some embodiments, audio items in a playback queue may be saved as a playlist. In certain embodiments, a playback queue may be empty, or populated but "not in use" when the playback zone or zone group is playing continuously streaming audio content, such as Internet radio that may continue to play until otherwise stopped, rather than discrete audio items that have playback durations. In some embodiments, a playback queue can include Internet radio and/or other streaming audio content items and be "in use" when the playback zone or zone group is playing those items.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped.

Figure 6:
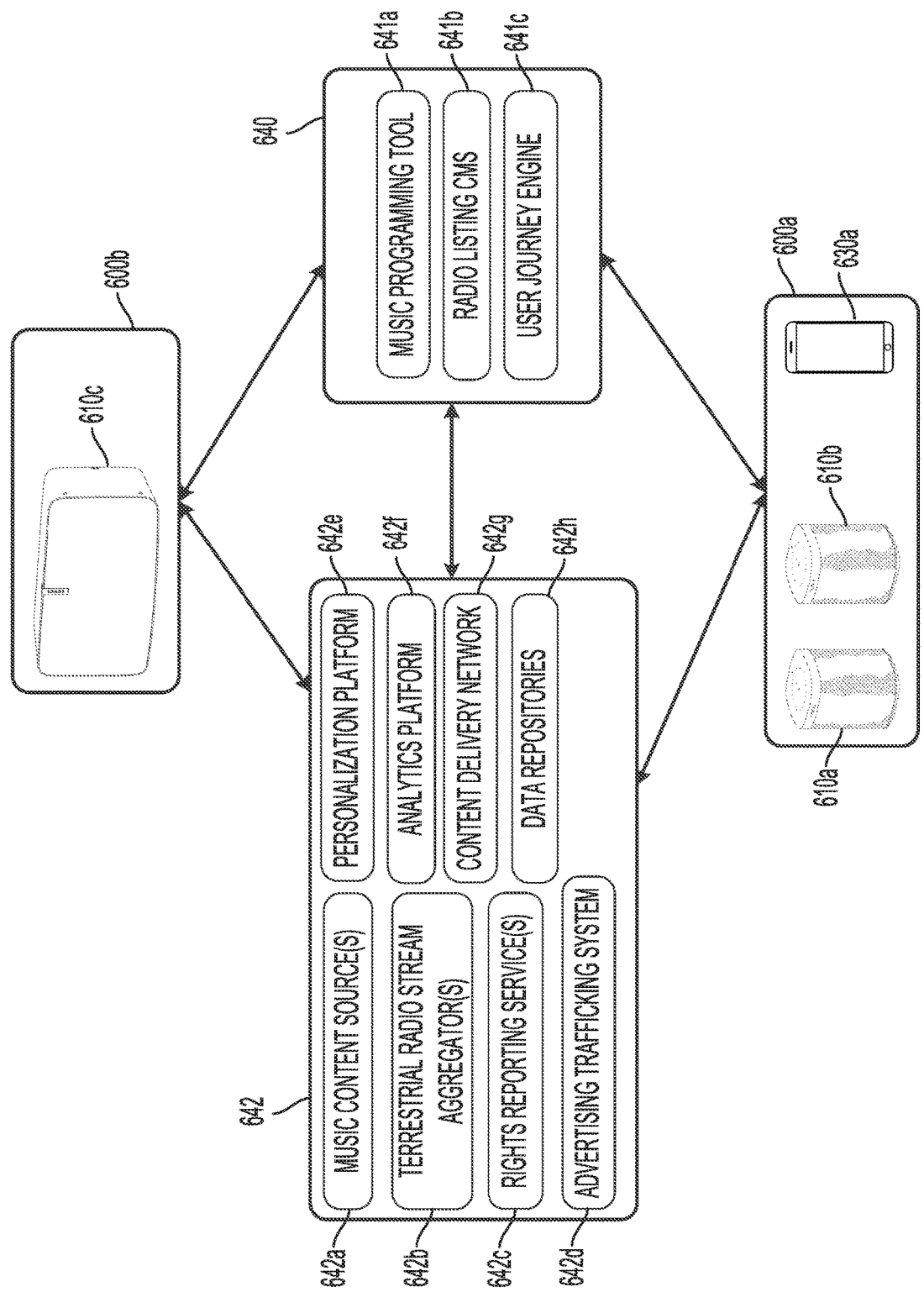
FIG. 6 is a schematic diagram of a computing system for providing internet radio content.

FIG. 6 is a schematic diagram of a computing system 640 that facilitates providing internet radio content to one or more media playback systems as discussed herein. For example, the computing system 640 may include one or more computing devices, including the computing device(s) 106 of the cloud network(s) 102 shown in FIG. 2 and discussed above. The computing system 640 may include, for example, a music programming tool 641a that may be used by administrators of the media playback system provider to assemble and program the media content for each internet radio station's playlist. Further, the computing system 640 may include a radio listing content management system (CMS) 641b. The radio listing CMS may be used to find, verify, and store data regarding terrestrial radio streams that may be provided by one or more terrestrial radio stream aggregators.

The computing system 640 may also include a user journey engine 641c, which may utilize operational data from a given media playback system, such as the media playback system 600a, or from a particular playback device such as the playback device 610a, to make predictions regarding user interests and/or user activity within the media playback system 600a. In some implementations, the user journey engine 641c may coordinate with other computing systems to make such predictions, as further discussed below. Accordingly, this information may be used to provide targeted advertisements to the media playback system 600a according to the examples herein.

FIG. 6 also shows a plurality of additional computing systems 642 with which the computing system 640 may integrate and/or cooperate. For example, the additional computing systems 642 include music content sources 642a operated by a respective music service, such as the example music services 433g discussed above (e.g., Spotify, etc.). In some implementations, for the internet radio content discussed herein, the media playback system provider itself (e.g., Sonos) may operate similar to the music services 433g discussed above, curating and assembling the internet radio content and maintaining one or more of the media content source(s) 642a shown in FIG. 6. The additional computing systems 642 may also include terrestrial radio stream aggregators 642b and rights reporting services 642c that track the digital rights associated with given media content. For instance, unlike traditional terrestrial radio where it may be difficult to determine how many listeners were tuned in during playback of a given song, the implementations discussed herein can provide much more granular listener information. Operational data from one or more media playback systems may indicate, for example, how many playback devices played back a given song, where the playback devices were likely located, an estimation of user presence, among other information. In some cases, this additional information may be used to develop more specific arrangements and fee schedules for the licensing of digital content playback.

The additional computing system 642 may also include an advertisement trafficking system 642d, a personalization platform 642e, and an analytics platform 642f, among many other possibilities. Further, the computing system 640 may cooperate with computing systems and networks that facilitate the data exchanges involved herein, including a content delivery network (CDN) 642g, and one or more data repositories 642h.

For instance, a first media playback system 600a and a second media playback system 600b may receive media content corresponding to an internet radio stream via the CDN 642g. As the media content is played back by a first playback device 610a and a second playback device 610b in the first media playback system 600a, and by a third playback device 610c in the second media playback system 600b, operational data corresponding to each system may be stored in the one or more data repositories 642h. As discussed above, the operational data may include, for each media playback system, listening history corresponding to one or more identified user profiles, the number, model(s), configuration(s), and/or playback settings of the playback devices in the media playback system, data regarding the media content sources available to the media playback system, indications of possible playback device locations within the media playback system, and indications of the likelihood of user presence, among other examples.

In some implementations, the user journey engine 641c may access the operational data stored in the data repositories 642h and then coordinate with one or both of the personalization platform 642e and the analytics platform 642f in order to analyze the data and make predictions regarding user interests and/or user activity within a given media playback system. For instance, operational data may be available from a substantial number of diverse media playback systems. The user journey engine 641c may work in conjunction with the analytics platform 642f to apply machine learning and/or other analytics to determine outcomes that are correlated with certain aspects of the operational data, and to predict future outcomes based on related or similar operational data. Further, the user journey engine 641c may further coordinate with the personalization platform 642e to apply trends and other predictive information discussed herein to any number of products, services, media content, and the like in a way that presents targeted advertisements that are more likely to be meaningful to particular users of a given media playback system.

This information may then be utilized in conjunction with the advertisement trafficking system 642d to provide the targeted advertisements as part of a given internet radio stream. In some implementations, a given advertisement may be played during a time slot designated for advertisements that occurs between songs of the internet radio stream, i.e., after the end of one song and before the beginning of the next song. In other embodiments, the advertisement trafficking system 642d may analyze the upcoming audio content of a given internet radio stream to identify periods within the audio content that are conducive to overlaying the playback of an advertisement. For example, a song that fades out with a lengthy ending may lend itself to overlaying the audio of an advertisement. Similarly, a song with a lengthy build-up at the beginning of the song may also be a candidate for overlaid advertisements. Thus, the advertisement trafficking system 642d may overlay a given advertisement onto the transition between two appropriately selected songs, such that the advertisement plays over the end of the first and the beginning of the second song. In some embodiments, the volume level of the underlying songs might be ducked to improve clarity of the advertisements. Other examples are also possible.

As shown in FIG. 6, both the media playback system 600a and the media playback system 600b communicate with the computing system 640 as well as one or more of the additional computing systems 642 during playback of content from a given internet radio station. For example, the computing system 640 maintains a playlist of media items in a queue for playback, along with an indication of a current playback position within the playlist, which is always advancing. To facilitate playback, the computing system 640 may provide one or more media items from the playlist to the playback device 610a, along with an indication of the current playback position. The current playback position may be, for example, a timestamp corresponding to a position within a given media content, or an indication of a particular audio frame with the media content where playback should begin. The indications of the current playback position may take other forms as well.

The one or more media items provided by the computing system 640 to the playback device 610a may include a URI, a URL, or a similar identifier that allows the playback device 610a to retrieve the media content for playback. For example, the one or more media items may "point" to media content on one or more of the media content sources 642a shown in FIG. 6. As playback continues and the current playback position progresses, the computing system 640 may send additional media items from the playlist to the playback device 610a. In some implementations, the computing system 640 might also send an updated indication of the current playback position, which may allow the playback device 610a to update its playback position if it has drifted beyond a predetermined threshold. For example, the media playback system 600a may experience network attenuation that delays the retrieval of media content from the media content source 642a, causing the playback device 610a to "fall behind" the current playback position maintained by the computing system 640. If the playback device 610a determines that the delay is greater that a maximum value, such as 5 seconds, the playback device 610a may adjust playback of the media content so as to reduce the delay. Other thresholds are also possible.

Conversely, the computing system 640 may provide an indication of the current playback position that incorporates an allowance for some delay that may be expected for a given playback device to retrieve the media content. For example, such an allowance may be based on average media content retrieval speeds across a large number of playback devices, which may be available from the collected operational data. However, if the first playback device 610a is instead experiencing network speeds that are greater than average, its playback position may begin to drift ahead of the current playback position maintained by the computing system 640, and a similar correction may be required.

Such a correction might take various forms. For instance, if the computing system 640 determines that a given playback device's playback of the internet radio content has drifted too far ahead or too far behind other playback devices that are playing the same content, the computing system 640 may adjust the audio content that is provided to the given playback device. For example, the computing system 640 may timestretch the audio content of a song, or a portion thereof, to increase or decrease its tempo without changing its pitch, and then provide the adjusted audio content to the given playback device while other playback devices receive unadjusted content. In this way, the given playback device may become resynchronized, or substantially resynchronized, with other playback devices that are playing the same internet radio station.

Additionally or alternatively, a given playback device may determine that its current playback position within the playlist of media items is behind the indicated playback position provided by the computing system 640 by more than a threshold value, such as 5 seconds. In response, the given playback device may undertake a similar adjustment of the audio content that is received from the computing system 640. For example, the given playback device may timestretch the audio content to increase its tempo as discussed above, and then play back the adjusted audio content to thereby reduce the difference in its playback position.

In some implementations, the computing system 640 may provide a media item to the playback device 610a that corresponds to limited-access media content for which the playback device 610a might not have access credentials to browse or retrieve under other circumstances. Nonetheless, the limited-access media content may be enabled for retrieval and playback when accessed as part of the internet radio stream discussed herein. Some additional user experiences surrounding access to limited-access media in this way are further discussed below.

In a similar way, the computing system 640 may provide one or more media items and an indication of the current playback position within the playlist to the playback device 610c of the second media playback system 600b. This may result in the substantially synchronous playback of the internet radio stream by the playback device 610a and the playback device 610c. For instance, differences in playback timing up to 5 or even 10 seconds, which would be unacceptable in a multi-room playback scenario, may not have any appreciable impact on users listening to the same internet radio stream in separate media playback systems.

Figure 7:
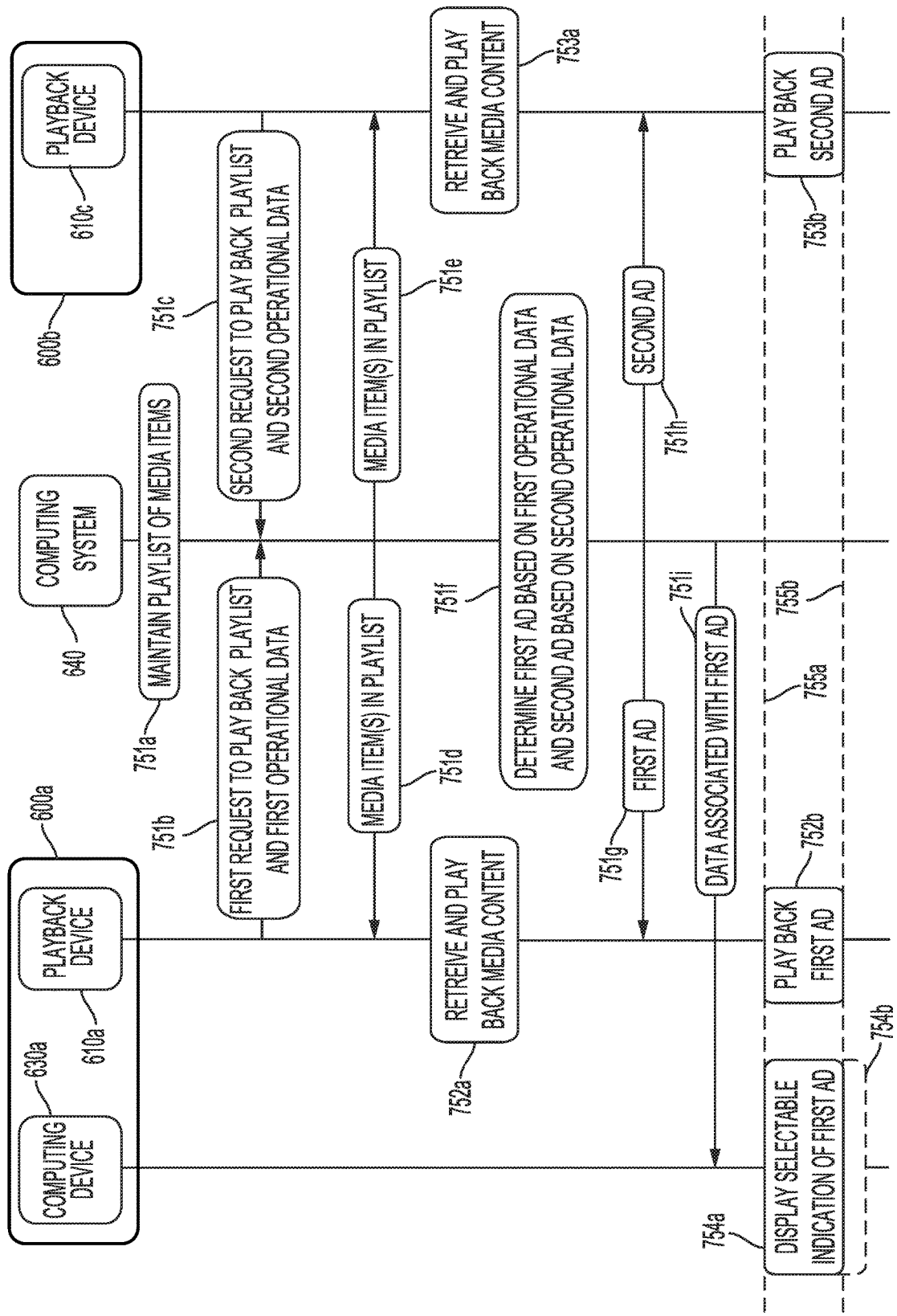
FIG. 7 is a message flow diagram involving a computing system and two media playback systems.

FIG. 7 is a message flow diagram involving an example computing system and two media playback systems. The example computing system may be the computing system 640 as shown in FIG. 6 and discussed above. Further, the first media playback system may be the media playback system 600a including playback device 610a shown in FIG. 6, as well as a computing device 630a (e.g., a smartphone) that operates as a control device of the media playback system 600a. Similarly, the second media playback system may be the media playback system 600b including playback device 610c.

At step 751a, the computing system 640 maintains the playlist of media items for playback by one or more playback devices. The playlist of media items may be accessible by the one or more playback devices as an internet radio station, podcast, or similar stream that is made available by the provider of the respective media playback systems to which each playback device belongs. Further, maintaining the playlist of media items may also include maintaining an indication of a current playback position within the playlist. As discussed above, the playlist of media items may include a plurality of time slots designated for advertisements.

In some implementations, maintaining the playlist of media items might include adding media items, removing media items, or otherwise updating the playlist. Such actions may be performed by an administrator of the playlist, for example. In other embodiments, the computing system 640 may make updates to the playlist, such as adding new content, based on various criteria, including data related to aggregated user taste preferences that were used to initially create the playlist, any updates to those taste preferences, a playback history of the playlist, and operational data of playback devices that have played the playlist. Other criteria are also possible.

At step 751b, the computing system 640 receives, from the first playback device 610a, a first request to play back the playlist of media items and first operational data corresponding to the first playback device 610a. In some implementations, the request for the first playback device 610a to play back the playlist might alternatively be transmitted by a control device of the media playback system 600a, such as the computing device 630a. Similarly, at step 751c, the computing system 640 receives, from the second playback device 610c, a second request to play back the playlist of media items and second operational data corresponding to the second playback device 610c. As noted above, the operational data corresponding to the first playback device 610a and the second playback device 610c may be wide-ranging. Further examples of such operational data and its uses are discussed in the examples below.

At step 751d, the computing system 640 provides one or more media items in the playlist to the first playback device 610a. Further, the computing system 640 may also provide an indication of the current playback position in the playlist, such that the first playback device 610a can begin playback at the same position, or substantially the same position, as other playback devices in other media playback systems that are also playing back the playlist. Similarly, at step 751e, the computing system 640 provides one or more media items in the playlist to the second playback device 610c. As above, the computing system 640 may also provide the indication of the current playback position to the second playback device 610c.

At block 752a, the first playback device 610a retrieves and plays back media content corresponding to the provided media items, and at block 753a, the second playback device 610c retrieves and plays back media content corresponding to the provided media items. As discussed above, this may involve the playback devices using the provided media items to retrieve corresponding media content from one or more media content sources 642a.

Although FIG. 7 schematically illustrates the computing system 640 receiving the two requests to play back the playlist at the same time, and then providing the media items at the same time, these steps might not occur in unison. Rather, the first playback device 610a may transmit the first request to play back the playlist at a first time, and may receive from the computing system 640 the one or more media items and the indication of the current playback system shortly thereafter. At a second time, after the first playback device has already begun playing back the playlist of media items, the second playback device 610c may transmit the second request. Accordingly, the computing system 640 may provide one or more media items different from those initially received by the first playback device 610a, and/or an updated indication of the current playback position. In this way, the second playback device 610c can "join" the ongoing internet radio stream that the first playback device 610a is already playing back.

On the other hand, once both playback devices are engaged in ongoing playback of the playlist of media items, the computing system 640 might, as the current playback position progresses through the playlist, provide additional media items to the first playback device 610a and the second playback device 610c for playback at substantially the same time. Similarly, the playback devices may continue to provide updated operation data to the computing system 640 as playback proceeds.

At step 751f, the computing system 640 may determine a first advertisement to be provided to the first playback device 610a based on the first operational data. The computing system 640 may also determine a second advertisement to be provided to the second playback device 610c based on the second operational data. As above, although these actions are shown schematically as occurring in the same step 751f, they need not be performed by the computing 640 at the same time.

For example, the computing system 640 may determine one or more advertisements for the first playback device 610a in response to receiving the first operational data from the first playback device 610a. Thereafter, additional advertisements may be determined while playback of the playlist of media items progresses, and may be determined based on updated operational data. In some cases, advertisements that have already been determined for playback by the first playback device 610a may be replaced by updated advertisements, based on updated operational data that warrants such as a change.

At step 751g, the computing system 640 provides the first advertisement to the first playback device 610a for playback during a given time slot in the playlist. Further, at step 751h, the computing system 640 provides the second advertisement to the second playback device 610c for playback during the given time slot, such that the second playback device 610c plays the second advertisement while the first playback device 610a plays the first advertisement. Accordingly, at step 752b, the first playback device 610a plays back the first advertisement, and at step 753b, the second playback device 610c plays back the second advertisement.

In this way, the first playback device 610a and the second playback device 610c, located in different media playback systems, may experience the same media content in substantial synchrony as they play back the media items in the playlist, while receiving different advertisements during the same advertising time slot.

As suggested by FIG. 7, the computing system 640 may provide the first and second advertisements to the respective playback devices at steps 751g and 751h, at substantially the same time. However, this is not necessarily required, and the advertisements might be provided at different times as well, prior to the playback of the respective advertisements.

In some implementations, the computing system 640 may also provide, to the computing device 630a or a similar control device of the first media playback system 600a, data associated with the first advertisement. The computing device 630a may use the data to display a selectable indication related to the first advertisement. For example, the selectable indication may be a link that a user may select to take them to an interface for purchasing an advertised product, or for signing up for an advertised service. Other examples are also possible and will be further discussed below.

As noted above, many of the steps shown in the flow chart of FIG. 7 need not occur in the order presented, unless otherwise noted. However, the playback of the respective advertisements across each playback device does occur in substantial unison during the given time slot. The dashed lines 755a and 755b in FIG. 7 represent the beginning and end of the given time slot, during which the advertisements are played back.

Alternatively, in some embodiments, the computing system 640 might provide to the playback device 610a and the playback device 610c advertisements that are not the same duration during a given time slot. For instance, the playback device 610a might receive and play back a first advertisement that is 10 seconds in length, whereas the playback device 610*c* might receive and play back a second advertisement that is 15 seconds in length. As such, when playback of the internet radio station audio content resumes after the respective advertisements, a 5 second difference in playback has been introduced to the substantially synchronous playback by the two playback devices. The computing system 640 may correct for this difference as discussed above, by adjusting the tempo of the audio content provided to one or both playback devices, among other possibilities.

Alternatively, the computing system 640 may add a brief period of silence before and/or after the shorter advertisement such that it spans the same advertising time slot as the longer advertisement. For instance, the computing system 640 may insert 2.5 seconds of silence both before and after the 10 second advertisement, resulting in a 15 second time period that matches the longer advertisement.

In some other examples, the computing system 640 may determine advertisements of differing length as a way to reduce playback timing differences between playback devices. For instance, if a given playback device has a playback position that is lagging 5 seconds behind the indication of the playback position that is maintained by the computing system 640, the computing system 640 may determine an advertisement for the given playback device that is only 10 seconds in length, whereas other playback devices that are playing back the internet radio content may be provided with advertisements that are 15 seconds in length. Other examples are also possible.

In some implementations, the selectable indication that is displayed on the computing device 630*a* may persist after the end of the given advertising time slot, as shown by the dashed line 754*b*. For example, although playback of the first advertisement has ended and the first playback device 610*a* has continued with playback of the next media item from the playlist, the computing device 630*a* may continue to display the selectable indication related to the first advertisement, which may give a user an opportunity to, for example, retrieve and consider the selectable indication. The selectable indication may persist for a predetermined time, such as 15 second after playback of the first advertisement ends. In some cases, certain user activities might extend the persistence of the selectable indication, such as an interaction with the computing device 630*a* within a predetermined time. Additionally or alternatively, the selectable indications displayed by the computing device 630*a* may be stored by the computing device 630*a*, and later recalled by a user. Other variations are also possible.

In some examples, two playback devices in the same media playback system (e.g., operating on the same LAN), might play back two different advertisements, each with its own respective selectable indication that may be displayed on a control device of the media playback system. In this situation, a given control device within the media playback system may determine if it is within listening range of either of the two playback devices, and if so, display the corresponding selectable indication. For example, during the advertising time slot, the control device may detect, via an integrated microphone, the playback of one of the advertisements. Accordingly, the control device may display the corresponding selectable indication. Alternatively, if the control device's microphone detects neither advertisement being played back, the control device might display neither selectable indication. Other indicators for determining the listening proximity of a control device to a playback device in the media playback system, including WiFi signal strength, for example, are also possible.

IV. Example User Experiences

Figure 8:
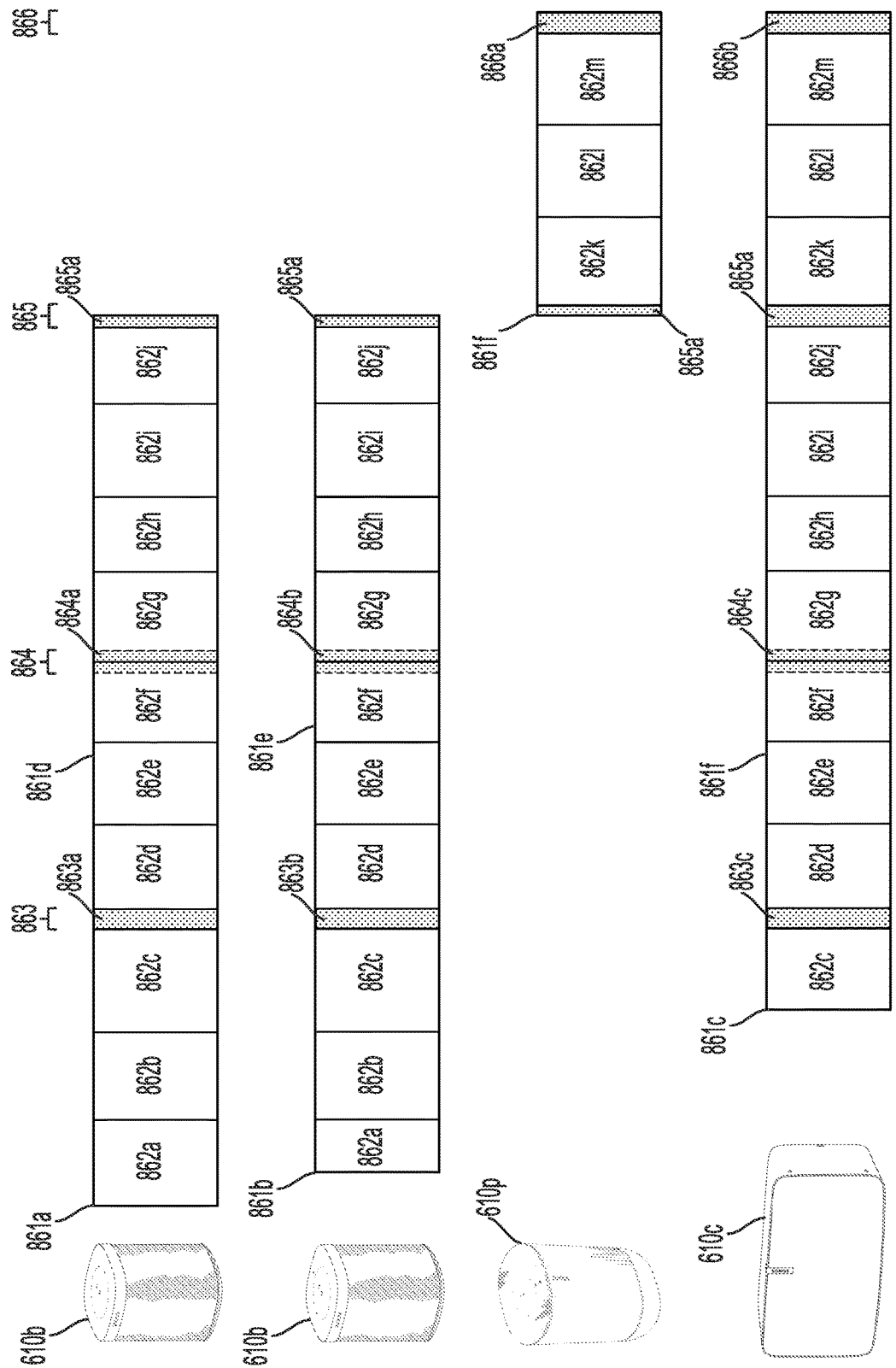
FIG. 8 is a schematic diagram of playback devices playing back an internet radio stream.

FIG. 8 is a schematic diagram of playback devices playing back an internet radio stream and will inform the discussion of some example user experiences that may be facilitated by the systems and operations herein.

For instance, FIG. 8 shows a graphical representation of a playlist 860 that is maintained by a computing system, such as the computing system 640 discussed above. The horizontal orientation of FIG. 8 from left to right corresponds to the passage of time, and items that are vertically aligned (e.g., the beginning and ending of a given media item) occur at substantially the same time, as discussed above.

The playlist 860 includes a series of thirteen media items labeled 862*a*-862*m*, as well as four time slots 863, 864, 865, and 866 that are designated for advertisements. Further, FIG. 8 shows four playback devices that play back the playlist 860 at various times, and the portion of the playlist 860 that is shown adjacent to each playback device in FIG. 8 represents the portion of the playlist 860 that is played back by that playback device, as will be apparent with reference to the examples below.

The four playback devices shown in FIG. 8 include the playback devices 610*a* and 610*b* discussed above, which operate as part of the first media playback system 600*a*. An additional playback device 610*p* that is also associated with the first media playback system 600*a* is also shown. The playback device 610*c* discussed above, which operates as part of the second media playback system 600*b*, is also depicted. Thus, FIG. 8 illustrates user experiences that may be facilitated within a given media playback system, as well as across multiple systems.

At a first point in time 861*a*, a first user of the first media playback system 600*a* may select, via a control device such as the computing device 630*a* discussed above, an internet radio station entitled "80's Pop Music" for playback. In response, the first playback device 610*a* begins playing back the playlist 860 of media items that is maintained by the computing system 640 for the "80's Pop Music" station. Shortly thereafter, at a second time 861*b* and during playback of the first media item 862*a*, the first user may group the second playback device 610*b* with the first playback device 610*a* for synchronous playback of the media items.

At a third time 861*c*, while the current playback position is in the midst of media item 862*c*, a user of the second media playback system 600*b* may initiate playback of the same "80's Pop Music" internet radio station on the playback device 610*c*. Accordingly, the playback device 610*c* begins playing back the playlist in substantial synchrony with the playback devices in the first media playback system 600*a*.

At some point prior to the advertising time slot 863 that follows media items 862*c*, the computing system 640 will determine, for each playback device that is playing back the playlist, an advertisement that is based on operational data provided to the computing system 640 by the playback devices. As one example, the operational data may include profile data associated with the media playback system account from which playback was initiated. For instance, the user of the first media playback system 600*a* may have populated their media playback system user account with demographic information such as age, gender, and music preferences (e.g., favorites), which might include a preference for 90's R&B music. In some cases, the music preferences of the user may be determined implicitly based on a usage history associated with the user account rather than explicit input from the user. The computing system 640 may then determine an advertisement to be played by the first playback device 610a based on some or all of this information. For example, users of a certain age and gender with a taste for both 80's pop music and 90's R&B music may fit the target demographic of a certain podcast that advertises via the media playback system. Thus, the computing system 640 may provide, and the first playback device 610a may play back, an advertisement 863a promoting the podcast. Concurrently, the user's control device may display a selectable indication for the user to subscribe to the podcast.

As another example, the operational data received by the computing system 640 may include configuration information for the second playback device 610b indicating that it has not been calibrated using built-in calibration features that can improve its playback quality. Accordingly, the playback device 610b may be provided with and play back an advertisement 863b promoting the benefits of the playback device's calibration features and suggesting that the user give them a try.

Further, the user of the second media playback system 600b may have indicated, either directly or indirectly, an interest in cooking in their media playback system user profile. Based on this data, as well as perhaps the user's geographic location and the time of year, the computing system 640 may provide an advertisement 863c to the playback device 610c for seasonal cooking supplies.

Accordingly, during the advertising time slot 863, each of the three playback devices discussed above plays back a different targeted advertisement. At the conclusion of the advertising time slot, each device resumes playback of the media items in the playlist, beginning with media item 862d.

As noted above, operational data may be provided to the computing system 640 on an ongoing basis during playback and may be used to inform the determination of upcoming advertisements. For example, the first playback device 610a may be named by the first user "Kitchen," indicating a reasonable likelihood that it is located in the kitchen of the first user's household. At a fourth time 861d, the first playback device 610a may detect, via an integrated networked microphone device (NMD), a voice command issued to a voice assistant service (VAS) to add an item to a grocery shopping list. Further, first user may have configured their VAS to utilize voice profile detection, and the issued voice command may match the first user's voice profile.

Consequently, the computing system 640 may utilize the operational data above to infer that, at time 861d, the first user was present in their kitchen and may have been involved in an activity related to food preparation. Accordingly, the computing system 640 may provide an advertisement 864a related to kitchen appliances to the first playback device 610a to be played in the second advertising time slot 864.

As another example, the second playback device 610b may also incorporate a NMD, and may be assigned the name "Office." At time 861e, the second playback device 610b may detect speech patterns via the NMD, although the speech may not include the designated activation words to issue a voice command. Nonetheless, the recognized speech pattern may suggest that a user is within listening distance of the second playback device 610b. Further, the computing system 640 may receive operational data indicating that a desktop control application registered to a second user account in the first media playback system 600a has come online and browsed other internet radio stations, although it did not issue any commands. The computing system 640 may also have access to correlating data suggesting that desktop control applications are often utilized by users who are at work, or who are working from home. Thus, the computing system 640 may infer that the second user of the first media playback system 600a is present in their home office and may be working. Therefore, an advertisement 864b related to productivity software may be provided to, and played back by, the second playback device 610b in the second advertising time slot 864.

In the second media playback system 600b, at time 861f, a volume control command is issued from a control device that is registered to a second user account of the second media playback system 600b. Unlike the playback devices in the first media playback system 600a, the playback device 600c may not be named in such a way that provides any insight into its location. For example, the playback device 600c may be named "Play:5," which may be a factory default naming convention that indicates only the playback device's model. However, the second user account of the second media playback system may have a listening history that includes a preference for sports-related podcasts and radio broadcasts. Based on at least this operational data and perhaps the user's geographic location, the computing system 640 may provide an advertisement 864c for an upcoming sporting event in the second user's area.

As shown in FIG. 8, the advertising time slot 864 may be designated for playback as a media content overlay during the transition between media items 862f and 862g. Accordingly, each of the three advertisements discussed above may be played back in this manner by the respective playback devices during the time slot 864.

The current playback position of the media items in the playlist 860 may eventually reach media item 862j, which may be a limited-access media item that is normally only playable, separate from the playlist of media items maintained by the computing system 640, from a given media content source. Further, the computing system 640 may determine, based on the received operational data, that none of the playback devices in the first and second media playback systems has access credentials for the given media content source. Therefore, the computing system 640 may provide an advertisement 865a, to be played during the advertising time slot 865, indicating that the song that was just played is only available from the given media content service, and promoting a subscription to the service. In this case, the same advertisement plays on each of the playback devices discussed above, as they each satisfy the same criteria related to the limited-access media.

Alternatively, an advertisement of this kind might instead precede the limited-access media, indicating that the upcoming song is only available from the given media content service, and promoting a subscription to the service. In situations where a given playback device already has access credentials for the given media content source, a different advertisement may be substituted.

Returning to FIG. 8, the first user of the first media playback system 600a may shift playback of the playlist 860 from the first and second playback device to a third playback device 610p, which may be a portable playback device. For example, the third playback device 610p may be a battery-operated playback device that can be used to play media content out loud wherever it is carried. Other types of portable playback devices are also possible including headphones and similar private listening devices.

As shown in FIG. 8, the first user may shift playback to the portable device during playback of the advertisement 865a. Thereafter, playback of the playlist 860 may proceed on the playback device 610p. In some implementations, the playback device 610p may have a self-calibration feature that facilitates maintaining a high playback quality level when it is moved from one spatial environment to another. In this example, the computing system 640 may receive operational data from the playback device 610p indicating that self-calibration occurred and detected a frequency response that is indicative of the playback device 610p being in an outdoor environment. Based on this data, the computing system 640 may infer that a user of the first playback system 600a has moved outdoors and may determine an advertisement 866a related to lawn and garden care, for example, to be played during the time slot 866.

Meanwhile, operation data related to the second playback system 600b may indicate that the playback device 600c is the only playback device in operation in the second media playback system 600b. Thus, the computing system 640 may determine an advertisement 866b promoting the benefits of multi-room, synchronous playback between multiple devices, and/or the ability to bond two playback devices for stereo playback or multiple playback devices in a home theatre arrangement.

In some implementations, as noted previously but unlike the examples discussed in FIG. 8, the computing system 640 might determine that there is a relatively low likelihood that a user is nearby a given playback device. For example, the operational data might include a period of time with little or no user interaction with the playback device. Additionally or alternatively, the operational data for a different playback device may indicate that a user is present near the different playback device, and not the device in question. As yet another example, the computing system 640 may determine the likely presence of a given user, but the given user might not match any of the target demographics for which advertisements are available. Accordingly, in some cases the computing system 640 may determine that no advertisement should be played back by a given playback device. Instead, the computing system 640 might provide a "blank" media item for playback during the advertising time slot. The blank media item may be silence, while noise, ocean waves, or similar. In embodiments where the advertisement would have been overlaid on the audio content of one or more songs, the songs might instead play back as normal without the overlaid advertisement. Other examples are also possible.

V. Conclusion

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only ways) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the foregoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. A computing system comprising:
   at least one processor;
   non-transitory computer-readable medium; and
   program instructions stored on the non-transitory computer-readable medium that, when executed by the at least one processor, cause the computing system to perform functions comprising:
   maintaining a scheduled playlist of media items for playback by one or more playback devices, wherein the scheduled playlist of media items comprises a plurality of scheduled time slots designated for advertisements;
   receiving, from a first playback device, (i) a first request to play back the scheduled playlist of media items and (ii) first operational data corresponding to the first playback device;
   receiving, from a second playback device, (i) a second request to play back the scheduled playlist of media items and (ii) second operational data corresponding to the second playback device;
   determining, based on the first operational data corresponding to the first playback device, a first advertisement to be provided to the first playback device;
   determining, based on the second operational data corresponding to the second playback device, a second advertisement to be provided to the second playback device, wherein the second advertisement is different from the first advertisement;
   based on the first request and the second request, respectively providing one or more media items in the scheduled playlist of media items to the first playback device and the second playback device for substantially synchronous playback by the first playback device and the second playback device;

providing the first advertisement to the first playback device for playback during a given time slot of the scheduled time slots; and providing the second advertisement to the second playback device for playback during the given time slot, such that the second playback device plays back the second advertisement while the first playback device plays back the first advertisement.

2. The computing system of claim 1, wherein the first playback device is associated with a first media playback system, and wherein the second playback device is associated with a second media playback system different from the first media playback system.

3. The computing system of claim 1, wherein the first playback device is associated with a media playback system, and wherein the first operational data corresponding to the first playback device comprises data indicating a configuration of one or more other playback devices that are associated with the media playback system.

4. The computing system of claim 1, wherein the first operational data corresponding to the first playback device comprises an indication of one or more media content sources for which the first playback device has access credentials.

5. The computing system of claim 4, wherein a given media item in the one or more media items is playable from a given media content source, wherein the indication of one or more media content sources for which the first playback device has access credentials does not include the given media content source, and wherein the first advertisement is for the given media content source.

6. The computing system of claim 5, wherein the given media item is a limited-access media item that is only playable, separate from the scheduled playlist of media items, from the given media content source.

7. The computing system of claim 1, further comprising program instructions stored on the non-transitory computer-readable medium that, when executed by the at least one processor, cause the computing system to perform functions comprising:

while the first playback device plays back the first advertisement, causing a computing device that is installed with an application for controlling the first playback device to display, via a user interface of the computing device, a selectable indication corresponding to the first advertisement.

8. The computing system of claim 1, wherein the first playback device is associated with a media playback system, and wherein the first operational data corresponding to the first playback device comprises a name assigned to the first playback device that indicates a location of the first playback device within the media playback system.

9. The computing system of claim 1, wherein the first operational data corresponding to the first playback device comprises data indicating a playback history of the first playback device.

10. The computing system of claim 1, wherein the first playback device includes a network microphone device that is configured for audio detection, and wherein the first operational data corresponding to the first playback device comprises data related to one or more voice commands detected by the first playback device.

11. The computing system of claim 10, wherein the data related to the one or more voice commands detected by the first playback device includes an identification of a particular voice profile.

12. The computing system of claim 1, wherein the first playback device is associated with a media playback system operating over a data network, and wherein the first operational data corresponding to the first playback device comprises data indicating a network activity level of the data network.

13. The computing system of claim 1, wherein the first operational data corresponding to the first playback device comprises data indicating a user input received by the first playback device during playback of a given one of the one or more media items.

14. The computing system of claim 13, wherein the data indicating the user input received by the first playback device comprises data indicating a volume change command for the first playback device.

15. A non-transitory computer-readable medium, wherein the non-transitory computer-readable medium is provisioned with program instructions that are executable to cause a computing system to perform functions comprising:

maintaining a scheduled playlist of media items for playback by one or more playback devices, wherein the scheduled playlist of media items comprises a plurality of scheduled time slots designated for advertisements;

receiving, from a first playback device, (i) a first request to play back the scheduled playlist of media items and (ii) first operational data corresponding to the first playback device;

receiving, from a second playback device, (i) a second request to play back the scheduled playlist of media items and (ii) second operational data corresponding to the second playback device;

determining, based on the first operational data corresponding to the first playback device, a first advertisement to be provided to the first playback device;

determining, based on the second operational data corresponding to the second playback device, a second advertisement to be provided to the second playback device, wherein the second advertisement is different from the first advertisement;

based on the first request and the second request, respectively providing one or more media items in the scheduled playlist of media items to the first playback device and the second playback device for substantially synchronous playback by the first playback device and the second playback device;

providing the first advertisement to the first playback device for playback during a given time slot of the scheduled time slots; and providing the second advertisement to the second playback device for playback during the given time slot, such that the second playback device plays back the second advertisement while the first playback device plays back the first advertisement.

16. The non-transitory computer-readable medium of claim 15, wherein the first playback device is associated with a media playback system, and wherein the first operational data corresponding to the first playback device comprises data indicating a configuration of one or more other playback devices that are associated with the media playback system.

17. The non-transitory computer-readable medium of claim 15, wherein the first operational data corresponding to the first playback device comprises an indication of one or more media content sources for which the first playback device has access credentials.

18. The non-transitory computer-readable medium of claim 15, wherein the non-transitory computer-readable medium is also provisioned with program instructions that are executable to cause the computing system to perform functions comprising:

while the first playback device plays back the first advertisement, causing a computing device that is installed with an application for controlling the first playback device to display, via a user interface of the computing device, a selectable indication corresponding to the first advertisement.

19. The non-transitory computer-readable medium of claim 15, wherein the first playback device is associated with a media playback system, and wherein the first operational data corresponding to the first playback device comprises a name assigned to the first playback device that indicates a location of the first playback device within the media playback system.

20. A method implemented by a computing system, the method comprising:

maintaining a scheduled playlist of media items for playback by one or more playback devices, wherein the scheduled playlist of media items comprises a plurality of scheduled time slots designated for advertisements;

receiving, from a first playback device, (i) a first request to play back the scheduled playlist of media items and (ii) first operational data corresponding to the first playback device;

receiving, from a second playback device, (i) a second request to play back the scheduled playlist of media items and (ii) second operational data corresponding to the second playback device;

determining, based on the first operational data corresponding to the first playback device, a first advertisement to be provided to the first playback device;

determining, based on the second operational data corresponding to the second playback device, a second advertisement to be provided to the second playback device, wherein the second advertisement is different from the first advertisement;

based on the first request and the second request, respectively providing one or more media items in the scheduled playlist of media items to the first playback device and the second playback device for substantially synchronous playback by the first playback device and the second playback device;

providing the first advertisement to the first playback device for playback during a given time slot of the scheduled time slots; and providing the second advertisement to the second playback device for playback during the given time slot, such that the second playback device plays back the second advertisement while the first playback device plays back the first advertisement.

* * * * *